US012633878B2

(12) United States Patent
Tomita et al.

(10) Patent No.: US 12,633,878 B2
(45) Date of Patent: May 19, 2026

(54) TRACKER CIRCUIT, COMMUNICATION DEVICE, AND VOLTAGE SUPPLY METHOD

(71) Applicant: Murata Manufacturing Co., Ltd., Nagaokakyo (JP)

(72) Inventors: Naohide Tomita, Nagaokakyo (JP); Takeshi Kogure, Nagaokakyo (JP); Taichi Yamaguchi, Cambridge, MA (US); Atsuya Hirono, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 120 days.

(21) Appl. No.: 18/611,116

(22) Filed: Mar. 20, 2024

(65) Prior Publication Data

US 2024/0333224 A1     Oct. 3, 2024

(30) Foreign Application Priority Data

Mar. 27, 2023     (JP) ................................. 2023-049768

(51) Int. Cl.
| | |
|---|---|
| *H03F 3/24* | (2006.01) |
| *H03F 1/02* | (2006.01) |
| *H04B 1/04* | (2006.01) |

(52) U.S. Cl.
CPC ........... *H03F 1/0238* (2013.01); *H03F 3/245* (2013.01); *H04B 1/04* (2013.01); *H03F 2200/105* (2013.01); *H03F 2200/451* (2013.01)

(58) Field of Classification Search
CPC .......... H02M 1/00; H02M 3/07; H02M 3/158; H03F 1/02; H03F 1/32; H03F 1/56; H03F 1/0238; H03F 3/19; H03F 3/21; H03F 3/24; H03F 3/189; H03F 3/195; H03F 3/213; H03F 3/245; H03M 1/12; H04B 1/04
USPC .... 330/9, 136, 296–297; 341/144, 150, 172; 375/219, 295–297
See application file for complete search history.

(56) References Cited

U.S. PATENT DOCUMENTS

| | | | |
|---|---|---|---|
| 8,829,993 B2 | 9/2014 | Briffa et al. | |
| 10,840,805 B2 * | 11/2020 | Perreault | ............... H03F 3/2178 |
| 2022/0224289 A1 * | 7/2022 | Kim | ......................... H03F 3/245 |
| 2022/0329217 A1 * | 10/2022 | Khlat | ................... H03F 3/45475 |

* cited by examiner

*Primary Examiner* — Shawkat M Ali
(74) *Attorney, Agent, or Firm* — ArentFox Schiff LLP

(57)     ABSTRACT

A tracker circuit is provided that includes a first switched-capacitor circuit configured to generate a plurality of first discrete voltages, a second switched-capacitor circuit configured to generate a plurality of second discrete voltages, and a supply modulator configured to selectively output at least one of the plurality of first discrete voltages and the plurality of second discrete voltages to a power amplifier. One of the plurality of first discrete voltages has a level different from levels of the plurality of second discrete voltages, and one of the plurality of second discrete voltages has a level different from levels of the plurality of first discrete voltages.

20 Claims, 13 Drawing Sheets

TRACKER CIRCUIT, COMMUNICATION DEVICE, AND VOLTAGE SUPPLY METHOD

CROSS REFERENCE TO RELATED APPLICATIONS

The present disclosure claims the benefit of priority to Japanese Patent Application No. 2023-049768, filed Mar. 27, 2023, which is incorporated by reference herein in its entirety.

TECHNICAL FIELD

The present disclosure relates to a tracker circuit, a communication device, and a voltage supply method.

BACKGROUND

In recent years, power-added efficiency has been improved by applying envelope tracking (ET) to a power amplifier circuit. In an example, U.S. Pat. No. 8,829,993 discloses a digital envelope tracking (D-ET) technology for selectively supplying, based on an envelope signal, a plurality of discrete voltages.

Moreover, in the 5G standard (for example, Reduced Capability (RedCap)) for Internet of Things (IoT), further improvement of power efficiency is required in order to reduce power consumption.

SUMMARY OF THE INVENTION

In view of the foregoing, the present disclosure provides a tracker circuit, a communication device, and a voltage supply method that improves power efficiency in a D-ET mode.

Specifically, a tracker circuit according to one aspect of the present disclosure includes a first switched-capacitor circuit configured to generate a plurality of first discrete voltages, a second switched-capacitor circuit configured to generate a plurality of second discrete voltages, and a supply modulator configured to selectively output at least one of the plurality of first discrete voltages and the plurality of second discrete voltages to a power amplifier. One of the plurality of first discrete voltages has a voltage level different from levels of the plurality of second discrete voltages, and one of the plurality of second discrete voltages has a voltage level different from levels of the plurality of first discrete voltages.

In another exemplary aspect, a tracker circuit of the present disclosure is provided that includes a first switched-capacitor circuit, a second switched-capacitor circuit, and a supply modulator. The first switched-capacitor includes a first input terminal and a plurality of first output terminals. Each of the plurality of first output terminals outputs a respective one of a plurality of first discrete voltages. The second switched-capacitor circuit includes a second input terminal and a plurality of second output terminals. Each of the plurality of second output terminals outputs a respective one of a plurality of second discrete voltages. The supply modulator includes a plurality of third input terminals that is coupled to the plurality of first output terminals and the plurality of second output terminals. Each of the plurality of third input terminals is connected (or coupled) to a respective one of the plurality of first output terminals and the plurality of second output terminals. The supply modulator includes a third output terminal connected to a power amplifier. One of the plurality of first discrete voltages has a level different from levels of the plurality of second discrete voltages, and one of the plurality of second discrete voltages has a level different from levels of the plurality of first discrete voltages.

In another exemplary aspect, a communication device is provided that includes the tracker circuit, a signal processing circuit configured to process a radio frequency signal, and a radio frequency circuit that includes the power amplifier and is configured to transmit the radio frequency signal between the signal processing circuit and an antenna.

In yet another exemplary aspect, a voltage supply method that is operated in a tracker circuit is provided. In the exemplary method, a plurality of first discrete voltages is generated using a first switched-capacitor circuit of the tracker circuit. A plurality of second discrete voltages is generated using a second switched-capacitor circuit of the tracker circuit. At least one of the plurality of first discrete voltages and the plurality of second discrete voltages is selectively output to a power amplifier based on a supply modulator of the tracker circuit. One of the plurality of first discrete voltages has a level different from levels of the plurality of second discrete voltages, and one of the plurality of second discrete voltages has a level different from levels of the plurality of first discrete voltages.

According to the exemplary aspects of the present disclosure, power efficiency in a D-ET mode can be improved.

DETAILED DESCRIPTION

Hereinafter, exemplary embodiments of the present disclosure can be described in detail using the drawings. It is noted that any embodiments described below illustrate comprehensive or specific examples. Numerical values, shapes, materials, constituents, a disposition and a connection form of the constituents, and the like illustrated in the following embodiments are examples and are not intended to limit the present disclosure.

Each drawing is a schematic diagram that is highlighted, omitted, or adjusted in ratio, as appropriate, to illustrate the present disclosure and is not necessarily illustrated in a strict sense. Each drawing may have different shapes, positional relationships, and ratios from those in actuality. Substantially the same configurations are designated by the same reference signs in each drawing, and duplicate descriptions may be omitted or simplified.

It is noted that for purposes of this disclosure, in the circuit configuration, the term "connected" includes not only a case of being directly connected by a connection terminal and/or a wiring conductor, but also a case of being electrically connected through another circuit element. Moreover, the expression "directly connected" means being directly connected by a connection terminal and/or a wiring conductor without interposing another circuit element. The expression "C is connected between A and B" means that one end of C is connected to A and the other end of C is connected to B and means that C is disposed in series on a path connecting A to B. The expression "a path connecting A to B" means a path configured with a conductor that electrically connects A to B.

In an exemplary aspect of the disclosure, the term "terminal" means a point at which a conductor in an element ends. In a case where impedance of a conductor between elements is sufficiently low, a terminal is interpreted as not only a single point but also any point on the conductor between the elements or the entire conductor.

In an exemplary aspect of the disclosure, terms such as "parallel" and "perpendicular" indicating a relationship between elements, terms such as "rectangular" indicating a shape of an element, and numerical value ranges not only represent a strict meaning but also mean that a substantially equivalent range including, for example, an error of approximately a few % is included.

Figure 1A:
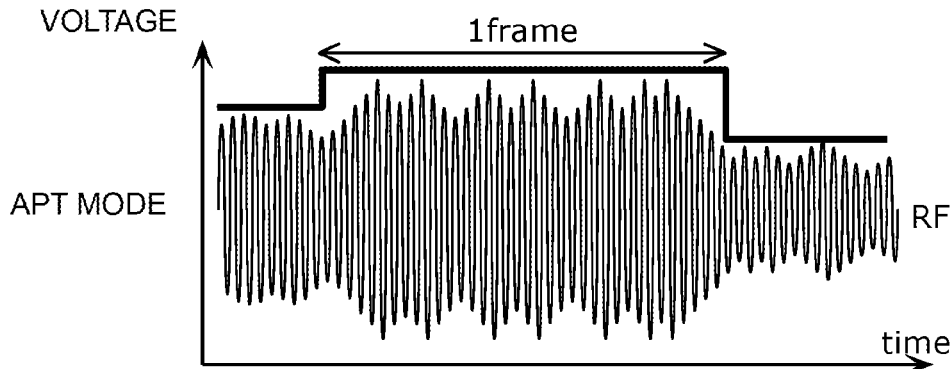
FIG. 1A is a graph illustrating an example of a transition of a power supply voltage in an average power tracking (APT) mode.
Figure 1B:
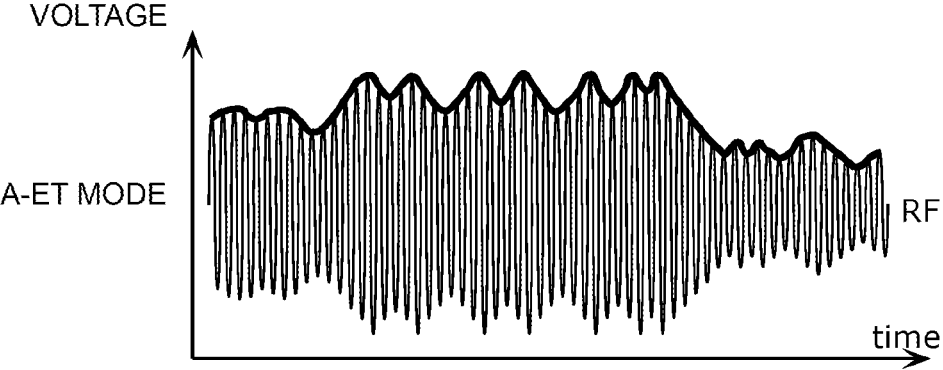
FIG. 1B is a graph illustrating an example of a transition of a power supply voltage in an analog envelope tracking (A-ET) mode.
Figure 1C:
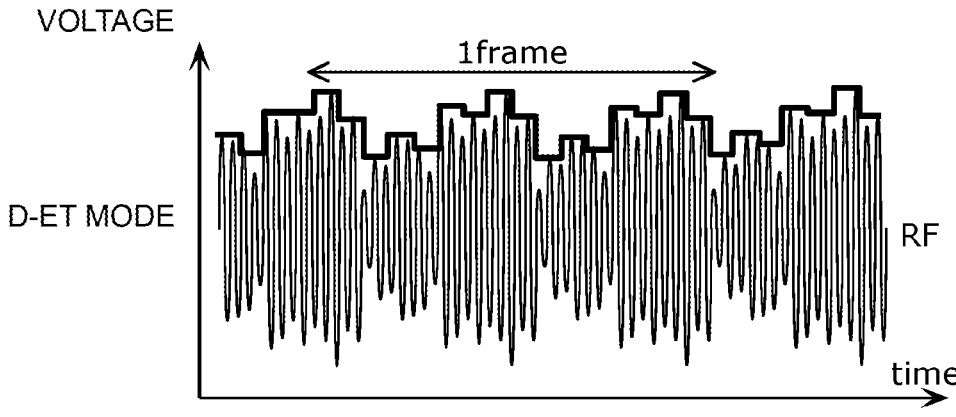
FIG. 1C is a graph illustrating an example of a transition of a power supply voltage in a D-ET mode.

In an exemplary aspect of the disclosure, a tracking mode in which a power supply voltage that is dynamically regulated over time based on a radio frequency signal is supplied to a power amplifier can be described as a technology for amplifying a radio frequency signal with high efficiency. The tracking mode is a mode in which the power supply voltage to be applied to the power amplifier is dynamically regulated. While there are several types of tracking modes, an APT mode, an A-ET mode, and a D-ET mode can be described here with reference to FIGS. 1A to 1C. In FIGS. 1A to 1C, a horizontal axis represents time, and a vertical axis represents a voltage. In addition, a thick solid line represents the power supply voltage, and a thin solid line (e.g., a waveform) represents a modulated signal.

FIG. 1A is a graph illustrating an example of a transition of the power supply voltage in the APT mode. In the APT mode, the power supply voltage is varied based on average power to a plurality of discrete voltage levels in units of frames.

For purposes of this disclosure, a frame means a unit forming the radio frequency signal (e.g., a modulated signal). For example, in 5th Generation New Radio (5G NR) and Long Term Evolution (LTE), the frame has 10 subframes, each subframe has a plurality of slots, and each slot is configured with a plurality of symbols. A subframe length is 1 ms, and a frame length is 10 ms.

A mode in which a voltage level is varied based on the average power in units of frames or in units larger than frames is referred to as the APT mode and is distinguished from a mode in which a voltage level is varied in units smaller than frames (for example, in units of subframes, slots, or symbols).

FIG. 1B is a graph illustrating an example of a transition of the power supply voltage in the A-ET mode. In the A-ET mode, an envelope of the modulated signal is tracked by continuously varying, based on an envelope signal, the power supply voltage.

The envelope signal is a signal indicating the envelope of the modulated signal. An envelope value is represented by, for example, the square root of $(I^2+Q^2)$. Here, (I, Q) represents a constellation point. The constellation point is a point representing a digitally modulated signal on a constellation diagram. For example, (I, Q) is determined based on transmission information by a baseband integrated circuit (BBIC).

FIG. 1C is a graph illustrating an example of a transition of the power supply voltage in the D-ET mode. In the D-ET mode, the envelope of the modulated signal is tracked by varying, based on the envelope signal, the power supply voltage to a plurality of discrete voltage levels in one frame. That is, in the D-ET, the power supply voltage varies at shorter time intervals than that in the APT.

In an exemplary aspect, a first embodiment (or Embodiment 1) of the disclosure can be discussed based on FIGS. 2-7. Hereinafter, Embodiment 1 will be described.

1.1 Circuit Configuration of Communication Device 7

Figure 2:
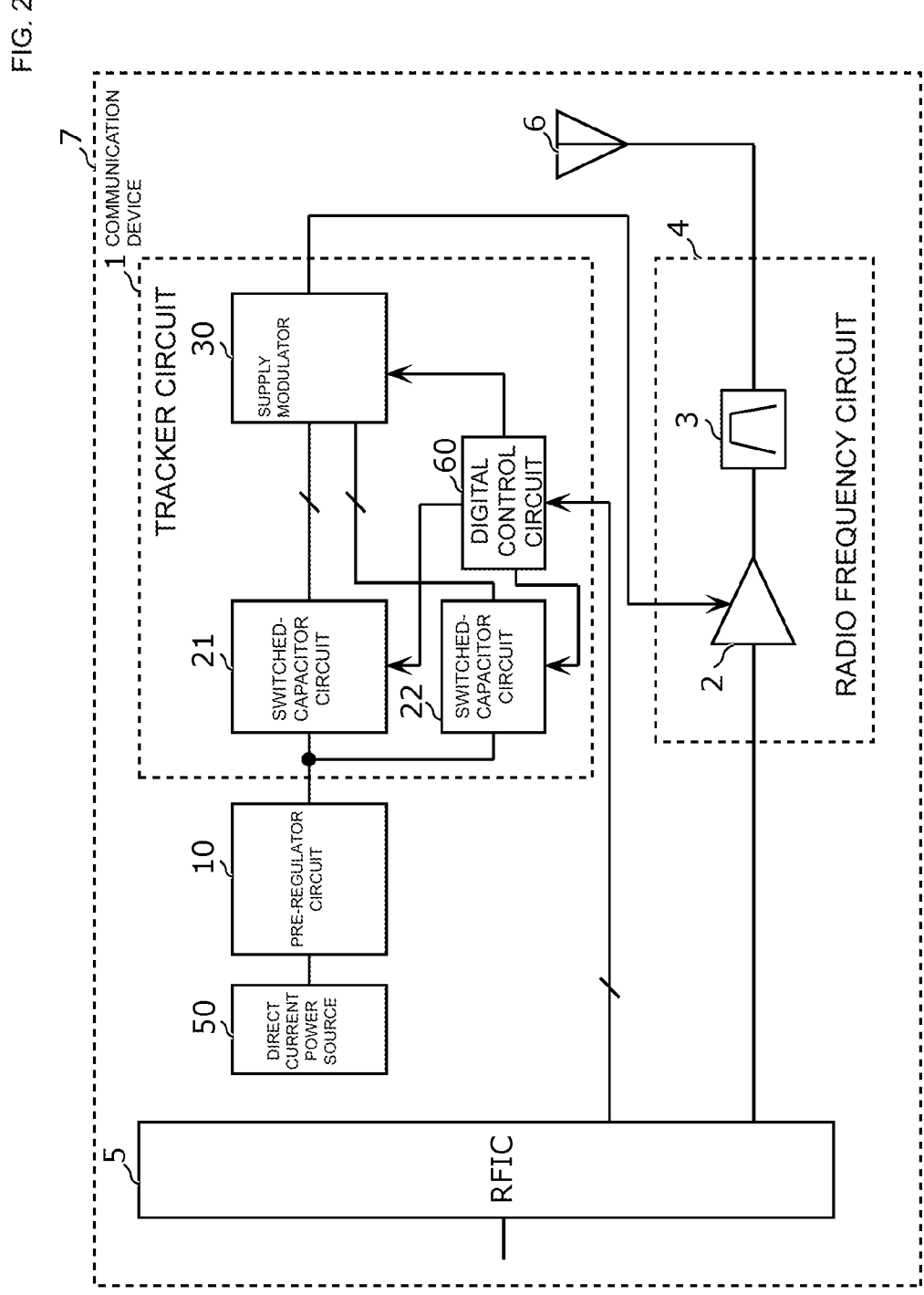
FIG. 2 is a circuit configuration diagram of a communication device according to an exemplary Embodiment 1.

As shown in FIG. 2, an exemplary circuit configuration of a communication device 7 according to the present embodiment (or first embodiment) can be described. FIG. 2 shows an exemplary circuit configuration diagram of the communication device 7 according to the present embodiment (or first embodiment).

FIG. 2 is an exemplary circuit configuration, and the communication device 7 may be mounted using any of various circuit mounting methods and circuit technologies. Accordingly, description of the communication device 7 provided below is not to be interpreted as being limiting.

The communication device 7 according to the present embodiment (or first embodiment) corresponds to user equipment (UE) in a cellular network (also referred to as a mobile network) and typically is a mobile phone, a smartphone, a tablet computer, a wearable device, or the like. The communication device 7 may be an Internet of Things (IoT) sensor/device, a medical/healthcare device, a vehicle, an unmanned aerial vehicle (UAV) (so-called drone), or an automated guided vehicle (AGV). In addition, the communication device 7 may function as a base station (BS) in the cellular network.

As illustrated in FIG. 2, the communication device 7 includes a tracker circuit 1, a radio frequency circuit 4, a radio frequency integrated circuit (RFIC) 5, an antenna 6, a pre-regulator circuit 10, and a direct current power source 50.

The tracker circuit 1 can supply a plurality of discrete voltages to a power amplifier 2 in the D-ET mode. Furthermore, the tracker circuit 1 may supply a plurality of discrete voltages to the power amplifier 2 in the APT mode. As illustrated in FIG. 2, the tracker circuit 1 includes switched-capacitor circuits 21 and 22, a supply modulator 30, and a digital control circuit 60.

The switched-capacitor circuits 21 and 22 are examples of a first switched-capacitor circuit and a second switched-capacitor circuit, respectively, and can generate a plurality of first discrete voltages and a plurality of second discrete voltages, respectively, from a regulated voltage (e.g., a first regulated voltage) supplied from the pre-regulator circuit 10. Circuit configurations of the switched-capacitor circuits 21 and 22 can be described later using FIG. 4.

The supply modulator 30 can selectively output at least one of the plurality of first discrete voltages and the plurality of second discrete voltages generated by the switched-capacitor circuits 21 and 22 to the power amplifier 2. That is, the supply modulator 30 can select at least one voltage from the plurality of first discrete voltages and from the plurality of second discrete voltages and supply the selected voltage to the power amplifier 2. A circuit configuration of the supply modulator 30 will be described later using FIG. 4.

The digital control circuit 60 can control, based on a digital control signal from the RFIC 5, the switched-capacitor circuits 21 and 22 and the supply modulator 30. In an example, the digital control circuit 60 can be configured to generate and output a control signal for controlling switches included in the switched-capacitor circuits 21 and 22 and a control signal for controlling switches included in the supply modulator 30. The digital control circuit 60 is not necessarily included in the tracker circuit 1. A circuit configuration of the digital control circuit 60 will be described later using FIG. 5.

According to an exemplary aspect, the pre-regulator circuit 10 may be referred to as a magnetic regulator or a direct current (DC)/DC converter. In the present embodiment, the pre-regulator circuit 10 is a buck-boost converter having one input and one output and can convert an output voltage of the direct current power source 50 into an input voltage (e.g., a first regulated voltage) of the switched-capacitor circuits 21 and 22. The pre-regulator circuit 10 may be a buck converter or a boost converter. The pre-regulator circuit 10 can change, based on, for example, the control signal from the RFIC 5, the input voltage of the switched-capacitor circuits 21 and 22. A circuit configuration of the pre-regulator circuit 10 can be described later using FIG. 3.

The direct current power source 50 can be configured to supply a direct current voltage to the pre-regulator circuit 10. For example, a rechargeable battery can be used as the direct current power source 50. However, the direct current power source 50 is not limited thereto.

The radio frequency circuit 4 can transmit a radio frequency signal between the RFIC 5 and the antenna 6. As illustrated in FIG. 2, the radio frequency circuit 4 includes the power amplifier 2 and a filter 3.

The power amplifier 2 is connected between the RFIC 5 and the filter 3. Furthermore, the power amplifier 2 is connected to the tracker circuit 1. The power amplifier 2 can amplify the radio frequency signal supplied from the RFIC 5 using the plurality of discrete voltages supplied from the tracker circuit 1.

The filter 3 is connected (or coupled) between the power amplifier 2 and the antenna 6. The filter 3 is a band pass filter having a passband including a predetermined band. The filter 3 is not necessarily included in the radio frequency circuit 4.

The predetermined band is a frequency band for a communication system constructed using radio access technology (RAT) and is defined in advance by standardizing bodies (for example, 3rd Generation Partnership Project (3GPP)®, Institute of Electrical and Electronics Engineers (IEEE), and the like). Examples of the communication system include a 5G NR system, an LTE system, and a Wireless Local Area Network (WLAN) system.

The antenna 6 transmits the radio frequency signal the radio frequency circuit 4. The antenna 6 is not necessarily included in the communication device 7.

The circuit configuration of the communication device 7 illustrated in FIG. 2 is illustrative and is not restrictive. For example, the communication device 7 may include a baseband signal processing circuit that performs signal processing using a frequency band lower than the radio frequency signal.

1.2 Circuit Configuration of Pre-Regulator Circuit 10

Figure 3:
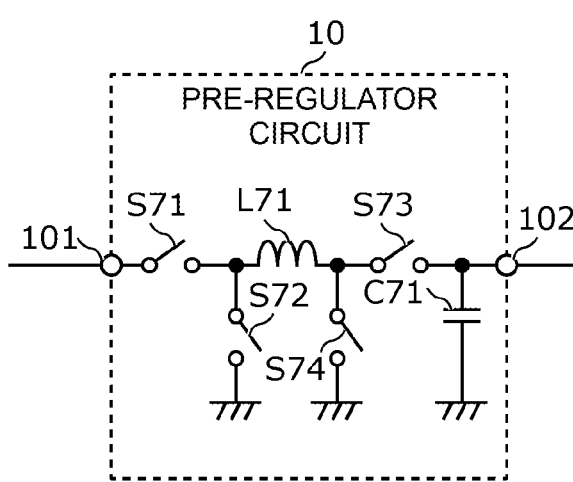
FIG. 3 is a circuit configuration diagram of a pre-regulator circuit according to the exemplary Embodiment 1.

As shown in FIG. 3, an exemplary circuit configuration of the pre-regulator circuit 10 can be provided. FIG. 3 shows an exemplary circuit configuration diagram of the pre-regulator circuit 10 according to the present embodiment (or first embodiment).

FIG. 3 is an exemplary circuit configuration, and the pre-regulator circuit 10 may be mounted using any of various circuit mounting methods and circuit technologies. Accordingly, description of the pre-regulator circuit 10 provided below is not to be interpreted as being limiting.

The pre-regulator circuit 10 includes an input terminal 101, an output terminal 102, switches S71 to S74, a power inductor L71, and a capacitor C71.

The input terminal 101 is a terminal for receiving the direct current voltage from the direct current power source 50. The input terminal 101 is connected to the direct current power source 50 outside the pre-regulator circuit 10 and is connected to the switch S71 inside the pre-regulator circuit 10.

The output terminal 102 is a terminal for supplying the regulated voltage to the switched-capacitor circuits 21 and 22. The output terminal 102 is connected to an input terminal 211 of the switched-capacitor circuit 21 and to an input terminal 221 of the switched-capacitor circuit 22 outside the pre-regulator circuit 10 and is connected to the switch S73 inside the pre-regulator circuit 10.

The power inductor L71 is an inductor used for raising and lowering the direct current voltage. One end of the power inductor L71 is connected to the switches S71 and S72, and the other end of the power inductor L71 is connected to the switches S73 and S74. In general, for purposes of this disclosure, it is noted that the term "one end" may generally be considered a "first end" and the term "another end" or the "other end" may generally be considered a "second end".

The switch S71 is connected between the input terminal 101 and the one end of the power inductor L71. In this connection configuration, ON/OFF switching of the switch S71 enables switching between connection and disconnection between the input terminal 101 and the one end of the power inductor L71.

The switch S72 is connected between the one end of the power inductor L71 and a ground. In this connection configuration, ON/OFF switching of the switch S72 enables switching between connection and disconnection between the one end of the power inductor L71 and the ground.

The switch S73 is connected between the other end of the power inductor L71 and the output terminal 102. In this connection configuration, ON/OFF switching of the switch S73 enables switching between connection and disconnection between the other end of the power inductor L71 and the output terminal 102.

The switch S74 is connected between the other end of the power inductor L71 and the ground. In this connection configuration, ON/OFF switching of the switch S74 enables switching between connection and disconnection between the other end of the power inductor L71 and the ground.

The capacitor C71 is connected between the ground and a path between the switch S73 and the output terminal 102. In an example, one of two electrodes of the capacitor C71 is connected to the switch S73 and to the output terminal 102, and the other of the two electrodes of the capacitor C71 is connected to the ground.

The configuration of the pre-regulator circuit 10 illustrated in FIG. 3 is illustrative and is not restrictive. For example, a part of the switches S71 to S74 may be replaced with a diode. In addition, a part or the entirety of the pre-regulator circuit 10 may be included in the tracker circuit 1.

1.3 Circuit Configuration of Tracker Circuit 1

Figure 4:
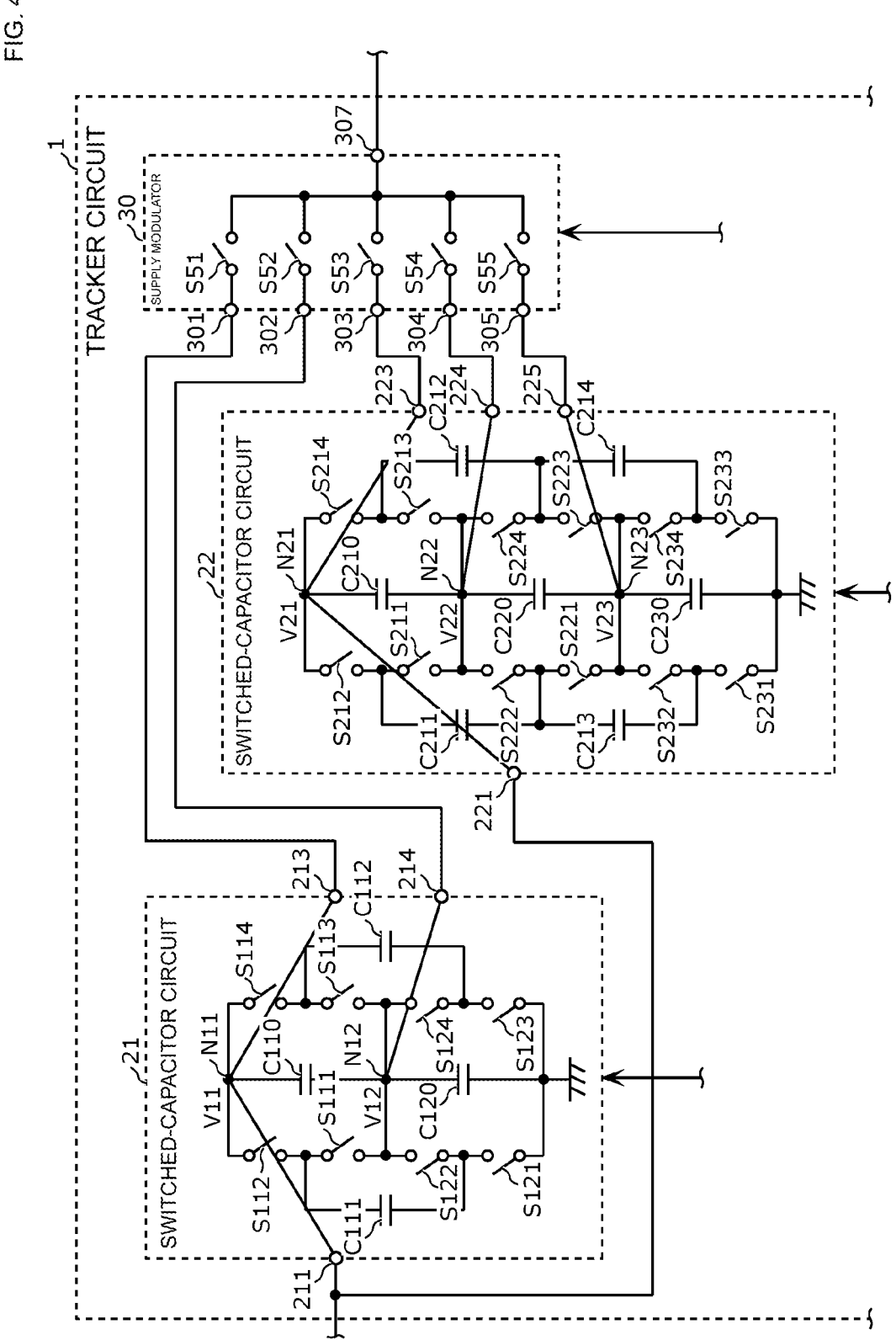
FIG. 4 is a partial circuit configuration diagram of a tracker circuit according to the exemplary Embodiment 1.
Figure 5:
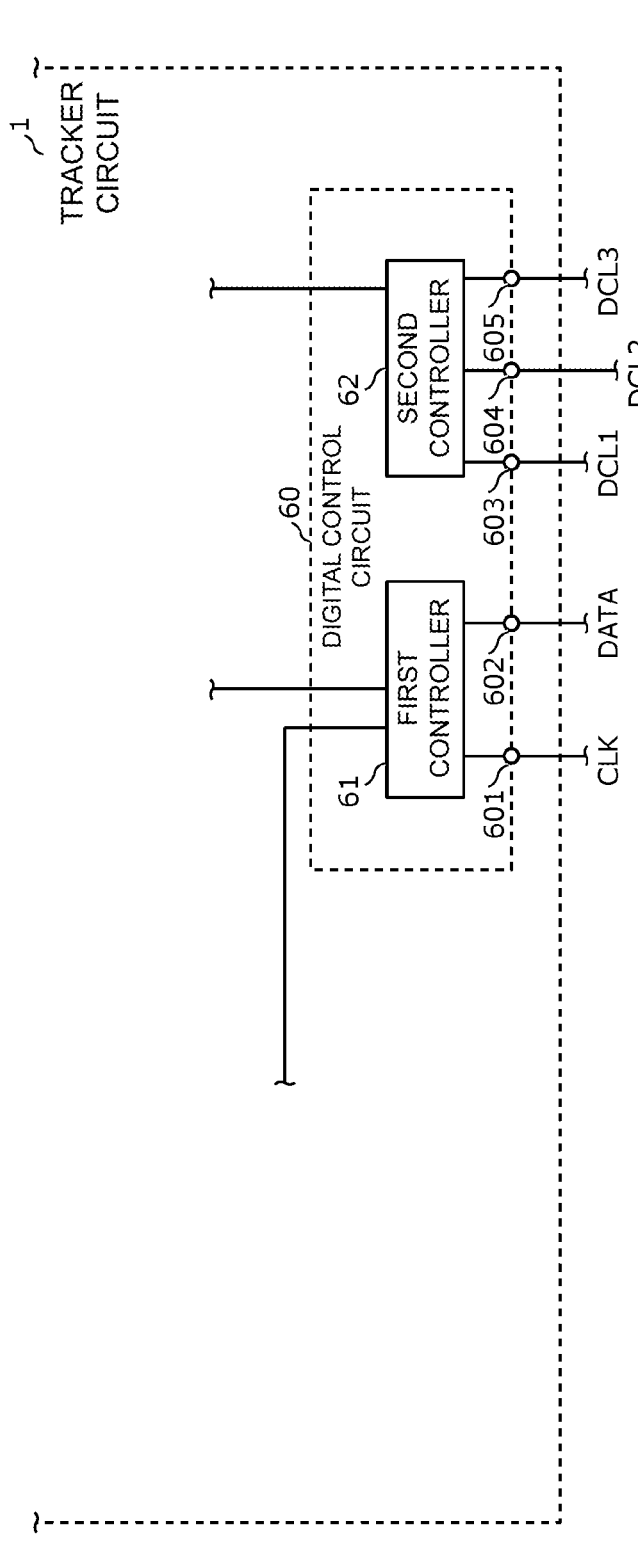
FIG. 5 is a partial circuit configuration diagram of the tracker circuit according to the exemplary Embodiment 1.

As shown in FIGS. 4-5, an exemplary circuit configuration of the tracker circuit 1 can be provided. FIGS. 4 and 5 show exemplary circuit configuration diagrams of the tracker circuit 1 according to the present embodiment (or first embodiment).

FIGS. 4 and 5 are exemplary circuit configurations, and the tracker circuit 1 may be mounted using any of various circuit mounting methods and circuit technologies. Accordingly, description of the tracker circuit 1 provided below is not to be interpreted as being limiting.

As described above, the tracker circuit 1 includes the switched-capacitor circuits 21 and 22, the supply modulator 30, and the digital control circuit 60. The tracker circuit 1 may include a filter circuit (not illustrated) between the supply modulator 30 and the power amplifier 2. In RedCap, use of half duplex-frequency division duplex (HD-FDD) has been reviewed, and there is a possibility of not using full duplex-frequency division duplex (FD-FDD). In a case where FD-FDD is not used, the tracker circuit 1 can contribute to size reduction of the communication device 7 by not including the filter circuit as in FIG. 4.

Hereinafter, the circuit configurations of the switched-capacitor circuits 21 and 22, the supply modulator 30, and the digital control circuit 60 can be described in order.

1.3.1 Circuit Configuration of Switched-Capacitor Circuit 21

Still referring to FIG. 4, an exemplary circuit configuration of the switched-capacitor circuit 21 can be provided. The switched-capacitor circuit 21 has a ladder circuit configuration. In an example, the switched-capacitor circuit 21 includes capacitors C110 to C112 and C120, switches S111 to S114 and S121 to S124, the input terminal 211, and output terminals 213 and 214. Energy and charges are input into a node N11 from the pre-regulator circuit 10 through the input terminal 211 and are output to the supply modulator 30 from nodes N11 and N12 through the output terminals 213 and 214.

The input terminal 211 is an example of a first input terminal and is a terminal for receiving the regulated voltage (e.g., V11) from the pre-regulator circuit 10. The input terminal 211 is connected to the pre-regulator circuit 10 outside the switched-capacitor circuit 21 and is connected to the node N11 inside the switched-capacitor circuit 21.

The regulated voltage (e.g., V11) is an example of the first regulated voltage and is supplied from the pre-regulator circuit 10.

The output terminal 213 is an example of a first output terminal and is a terminal for supplying an output voltage (e.g., V11) to the supply modulator 30. The output terminal 213 is connected to the supply modulator 30 outside the switched-capacitor circuit 21 and is connected to the node N11 inside the switched-capacitor circuit 21. The output terminal 213 may be integrated with the input terminal 211.

The output voltage (e.g., V11) is an example of a voltage included in the plurality of first discrete voltages and is generated from the regulated voltage (e.g., V11). In the present embodiment, the output voltage (e.g., V11) is equal to the regulated voltage (e.g., V11) and is higher than an output voltage (e.g., V12).

The output terminal 214 is an example of the first output terminal and is a terminal for supplying the output voltage (e.g., V12) to the supply modulator 30. The output terminal 214 is connected to the supply modulator 30 outside the switched-capacitor circuit 21 and is connected to the node N12 inside the switched-capacitor circuit 21.

The output voltage (e.g., V12) is an example of the voltage included in the plurality of first discrete voltages and is generated from the regulated voltage (e.g., V11). In the present embodiment, the output voltage (e.g., V12) is lower than the output voltage (V11).

The capacitors C111 and C112 are flying capacitors (also referred to as transfer capacitors) and are used for raising and/or lowering the regulated voltage (e.g., V11) supplied from the pre-regulator circuit 10. In an example, the capacitors C111 and C112 cause charges to move between the capacitors C111 and C112 and the nodes N11 and N12 and the ground such that V11 and V12 satisfying (V11−V12): (V12−VG)=1:1 and V11>V12>VG are maintained in the two nodes N11 and N12. Here, VG represents a ground potential.

One of two electrodes of the capacitor C111 is connected to one end of the switch S111 and to one end of the switch S112. The other of the two electrodes of the capacitor C111 is connected to one end of the switch S121 and to one end of the switch S122.

One of two electrodes of the capacitor C112 is connected to one end of the switch S113 and to one end of the switch S114. The other of the two electrodes of the capacitor C112 is connected to one end of the switch S123 and to one end of the switch S124.

The capacitors C111 and C112 can be charged and discharged in a complementary manner by repeating a first phase and a second phase.

In an example, in the first phase, the switches S112, S113, S122, and S123 are closed, and the switches S111, S114, S121, and S124 are open. Accordingly, the one of the two electrodes of the capacitor C111 is connected to the node N11, the other of the two electrodes of the capacitor C111 and the one of the two electrodes of the capacitor C112 are connected to the node N12, and the other of the two electrodes of the capacitor C112 is connected to the ground.

Meanwhile, in the second phase, the switches S112, S113, S122, and S123 are open, and the switches S111, S114, S121, and S124 are closed. Accordingly, the one of the two electrodes of the capacitor C112 is connected to the node N11, the other of the two electrodes of the capacitor C112 and the one of the two electrodes of the capacitor C111 are connected to the node N12, and the other of the two electrodes of the capacitor C111 is connected to the ground.

By repeating the first phase and the second phase, for example, one of the capacitors C111 and C112 can be discharged to the capacitor C120 while the other of the capacitors C111 and C112 is being charged from the node N11. That is, the capacitors C111 and C112 can be charged and discharged in a complementary manner.

The capacitors C110 and C120 are smoothing capacitors and are used for holding and smoothing the output voltages (e.g., V11 and V12) in the nodes N11 and N12.

The capacitor C110 is connected between the nodes N11 and N12. In an example, one of two electrodes of the capacitor C110 is connected to the node N11. Meanwhile, the other of the two electrodes of the capacitor C110 is connected to the node N12.

The capacitor C120 is connected between the node N12 and the ground. In an example, one of two electrodes of the capacitor C120 is connected to the node N12. Meanwhile, the other of the two electrodes of the capacitor C120 is connected to the ground.

The switch S111 is connected between the capacitor C111 and the node N12. In an example, the one end of the switch S111 is connected to the one of the two electrodes of the capacitor C111. Meanwhile, the other end of the switch S111 is connected to the node N12.

The switch S112 is connected between the capacitor C111 and the node N11. In an example, the one end of the switch S112 is connected to the one of the two electrodes of the capacitor C111. Meanwhile, the other end of the switch S112 is connected to the node N11.

The switch S121 is connected between the capacitor C111 and the ground. In an example, the one end of the switch S121 is connected to the other of the two electrodes of the capacitor C111. Meanwhile, the other end of the switch S121 is connected to the ground.

The switch S122 is connected between the capacitor C111 and the node N12. In an example, the one end of the switch S122 is connected to the other of the two electrodes of the capacitor C111. Meanwhile, the other end of the switch S122 is connected to the node N12.

The switch S113 is connected between the capacitor C112 and the node N12. In an example, the one end of the switch S113 is connected to the one of the two electrodes of the capacitor C112. Meanwhile, the other end of the switch S113 is connected to the node N12. That is, the other end of the switch S113 is connected to the other end of the switch S111 and to the other end of the switch S122.

The switch S114 is connected between the capacitor C112 and the node N11. In an example, the one end of the switch S114 is connected to the one of the two electrodes of the capacitor C112. Meanwhile, the other end of the switch S114 is connected to the node N11. That is, the other end of the switch S114 is connected to the other end of the switch S112.

The switch S123 is connected between the capacitor C112 and the ground. In an example, the one end of the switch S123 is connected to the other of the two electrodes of the capacitor C112. Meanwhile, the other end of the switch S123 is connected to the ground.

The switch S124 is connected between the capacitor C112 and the node N12. In an example, the one end of the switch S124 is connected to the other of the two electrodes of the capacitor C112. Meanwhile, the other end of the switch S124 is connected to the node N12. That is, the other end of the switch S124 is connected to the other end of the switch S111, the other end of the switch S122, and the other end of the switch S113.

A first set of switches including the switches S112, S113, S122, and S123 and a second set of switches including the switches S111, S114, S121, and S124 are turned ON and OFF in a complementary manner, based on the control signal from the digital control circuit 60. In an example, in the first phase, the first set of switches is closed, and the second set of switches is open. Conversely, in the second phase, the first set of switches is open, and the second set of switches is closed.

For example, charging of the capacitors C110 and C120 from the capacitor C111 is executed in one of the first phase and the second phase, and charging of the capacitors C110 and C120 from the capacitor C112 is executed in the other of the first phase and the second phase. That is, the capacitors C110 and C120 are always charged from the capacitor C111 or C112. Thus, even when a current flows from the nodes N11 and N12 to the switched-capacitor circuit 22 at a high speed, potential variations at the nodes N11 and N12 can be suppressed because the nodes N11 and N12 are charged at a high speed.

The switched-capacitor circuit 21, by operating in the above manner, can maintain almost equal voltages at both ends of each of the capacitors C110 and C120. In an example, V11 and V12 satisfying (V11−V12):(V12−VG) =1:1 are maintained in two nodes labeled V11 and V12.

According to an exemplary aspect of the disclosure, (V11−V12):(V12−VG) is not limited to 1:1 and may be designed to be any ratio, such as 2:1, 3:1, 3:2, 1:2, or 2:3.
1.3.2 Circuit Configuration of Switched-Capacitor Circuit 22

Still referring to FIG. 4, an exemplary circuit configuration of the switched-capacitor circuit 22 can be provided. In an example, the switched-capacitor circuit 22 has a ladder circuit configuration. In an example, the switched-capacitor circuit 22 includes capacitors C210 to C214, C220, and C230, switches S211 to S214, S221 to S224, and S231 to S234, the input terminal 221, and output terminals 223 to 225. Energy and charges are input into a node N21 from the pre-regulator circuit 10 through the input terminal 221 and are output to the supply modulator 30 from nodes N21 to N23 through the output terminals 223 to 225.

The input terminal 221 is an example of a second input terminal and is a terminal for receiving a regulated voltage (e.g., V21) from the switched-capacitor circuit 21. The input terminal 221 is connected to the pre-regulator circuit 10 outside the switched-capacitor circuit 22 and is connected to the node N21 inside the switched-capacitor circuit 22.

The regulated voltage (e.g., V21) is an example of the first regulated voltage and is supplied from the pre-regulator circuit 10. In the present embodiment, the regulated voltage (e.g., V21) has the same level as the regulated voltage (e.g., V11).

The output terminal 223 is an example of a second output terminal and is a terminal for supplying an output voltage (e.g., V21) to the supply modulator 30. The output terminal 223 is connected to the supply modulator 30 outside the switched-capacitor circuit 22 and is connected to the node N21 inside the switched-capacitor circuit 22. The output terminal 223 is not necessarily included in the switched-capacitor circuit 22, and the output terminal 223 may be integrated with the input terminal 221.

The output voltage (e.g., V21) is an example of a voltage included in the plurality of second discrete voltages and is generated from the regulated voltage (e.g., V21). In the present embodiment, the output voltage (e.g., V21) is equal to the regulated voltage (e.g., V21) and is higher than an output voltage (e.g., V22).

The output terminal 224 is an example of the second output terminal and is a terminal for supplying the output voltage (e.g., V22) to the supply modulator 30. The output terminal 224 is connected to the supply modulator 30 outside the switched-capacitor circuit 22 and is connected to the node N22 inside the switched-capacitor circuit 22. The output terminal 224 is not necessarily included in the switched-capacitor circuit 22, and the output terminal 224 may be integrated with the input terminal 222.

The output voltage (e.g., V22) is an example of the voltage included in the plurality of second discrete voltages and is generated from the regulated voltage (e.g., V21). In the present embodiment, the output voltage (e.g., V22) is lower than the output voltage (e.g., V21).

The output terminal 225 is an example of the second output terminal and is a terminal for supplying an output voltage (e.g., V23) to the supply modulator 30. The output terminal 225 is connected to the supply modulator 30 outside the switched-capacitor circuit 22 and is connected to the node N23 inside the switched-capacitor circuit 22.

The output voltage (e.g., V23) is an example of the voltage included in the plurality of second discrete voltages and is generated from the regulated voltage (e.g., V21). In the present embodiment, the output voltage (e.g., V23) is lower than the output voltage (e.g., V21) and is lower than the output voltage (e.g., V22).

The capacitors C211 to C214 are flying capacitors and are used for raising and/or lowering the regulated voltage (e.g., V21) supplied from the pre-regulator circuit 10. In an example, the capacitors C211 to C214 cause charges to move between the capacitors C211 to C214 and the nodes N21 to N23 and the ground such that V21 to V23 satisfying (V21−V22): (V22−V23):(V23−VG)=1:1:1 and V21>V22>V23 are maintained in the three nodes N21 to N23.

In an exemplary aspect of the disclosure, one of two electrodes of the capacitor C211 is connected (or coupled) to one end of the switch S211 and to one end of the switch S212. The other of the two electrodes of the capacitor C211 is connected to one end of the switch S221 and to one end of the switch S222.

In an exemplary aspect of the disclosure, one of two electrodes of the capacitor C212 is connected to one end of the switch S213 and to one end of the switch S214. The other of the two electrodes of the capacitor C212 is connected to one end of the switch S223 and to one end of the switch S224.

In an exemplary aspect of the disclosure, one of two electrodes of the capacitor C213 is connected to the one end of the switch S221 and to the one end of the switch S222. The other of the two electrodes of the capacitor C213 is connected to one end of the switch S231 and to one end of the switch S232.

In an exemplary aspect of the disclosure, one of two electrodes of the capacitor C214 is connected to the one end of the switch S223 and to the one end of the switch S224. The other of the two electrodes of the capacitor C214 is connected to one end of the switch S233 and to one end of the switch S234.

The capacitors C211 and C212 can be charged and discharged in a complementary manner by repeating the first phase and the second phase, and the capacitors C213 and C214 can be charged and discharged in a complementary manner by repeating the first phase and the second phase.

In an example, in the first phase, the switches S212, S213, S222, S223, S232, and S233 are closed, and the switches S211, S214, S221, S224, S231, and S234 are open. Accordingly, the one of the two electrodes of the capacitor C211 is connected to the node N21, the other of the two electrodes of the capacitor C211 and the one of the two electrodes of the capacitor C212 are connected to the node N22, and the other of the two electrodes of the capacitor C212 is connected to the node N23. In addition, the one of the two electrodes of the capacitor C213 is connected to the node N22, the other of the two electrodes of the capacitor C213 and the one of the two electrodes of the capacitor C214 are connected to the node N23, and the other of the two electrodes of the capacitor C214 is connected to the ground.

In an example, in the second phase, the switches S212, S213, S222, and S223 are open, and the switches S211, S214, S221, and S224 are closed. Accordingly, the one of the two electrodes of the capacitor C212 is connected to the node N21, the other of the two electrodes of the capacitor C212 and the one of the two electrodes of the capacitor C211 are connected to the node N22, and the other of the two electrodes of the capacitor C211 is connected to the node N23. In addition, the one of the two electrodes of the capacitor C214 is connected to the node N22, the other of the two electrodes of the capacitor C214 and the one of the two electrodes of the capacitor C213 are connected to the node N23, and the other of the two electrodes of the capacitor C213 is connected to the ground.

By repeating the first phase and the second phase, for example, one of the capacitors C211 and C212 can be discharged to the capacitor C220 while the other of the capacitors C211 and C212 is being charged from the node N21. That is, the capacitors C211 and C212 can be charged and discharged in a complementary manner. In the same manner, the capacitors C213 and C214 can also be charged and discharged in a complementary manner.

The capacitors C210, C220, and C230 are smoothing capacitors and are used for holding and smoothing the output voltages (e.g., V21 to V23) in the nodes N21 to N23.

The capacitor C210 is connected between the nodes N21 and N22. In an example, one of two electrodes of the capacitor C210 is connected to the node N21. Meanwhile, the other of the two electrodes of the capacitor C210 is connected to the node N22.

The capacitor C220 is connected between the nodes N22 and N23. In an example, one of two electrodes of the capacitor C220 is connected to the node N22. Meanwhile, the other of the two electrodes of the capacitor C220 is connected to the node N23.

The capacitor C230 is connected between the node N23 and the ground. In an example, one of two electrodes of the capacitor C230 is connected to the node N23. Meanwhile, the other of the two electrodes of the capacitor C230 is connected to the ground.

The switch S211 is connected between the capacitor C211 and the node N22. In an example, the one end of the switch S211 is connected to the one of the two electrodes of the capacitor C211. Meanwhile, the other end of the switch S211 is connected to the node N22.

The switch S212 is connected between the capacitor C211 and the node N21. In an example, the one end of the switch S212 is connected to the one of the two electrodes of the capacitor C211. Meanwhile, the other end of the switch S212 is connected to the node N21.

The switch S221 is connected between the capacitors C211 and C213 and the node N23. In an example, the one end of the switch S221 is connected to the other of the two electrodes of the capacitor C211 and to the one of the two electrodes of the capacitor C213. Meanwhile, the other end of the switch S221 is connected to the node N23.

The switch S222 is connected between the capacitors C211 and C213 and the node N22. In an example, the one end of the switch S222 is connected to the other of the two electrodes of the capacitor C211 and to the one of the two electrodes of the capacitor C213. Meanwhile, the other end of the switch S222 is connected to the node N22.

The switch S231 is connected between the capacitor C213 and the ground. In an example, the one end of the switch S231 is connected to the other of the two electrodes of the capacitor C213. Meanwhile, the other end of the switch S231 is connected to the ground.

The switch S232 is connected between the capacitor C213 and the node N23. In an example, the one end of the switch S232 is connected to the other of the two electrodes of the capacitor C213. Meanwhile, the other end of the switch S232 is connected to the node N23.

The switch S213 is connected between the capacitor C212 and the node N22. In an example, the one end of the switch S213 is connected to the one of the two electrodes of the capacitor C212. Meanwhile, the other end of the switch S213 is connected to the node N22. That is, the other end of the switch S213 is connected to the other end of the switch S211 and to the other end of the switch S222.

The switch S214 is connected between the capacitor C212 and the node N21. In an example, the one end of the switch S214 is connected to the one of the two electrodes of the capacitor C212. Meanwhile, the other end of the switch S214 is connected to the node N21. That is, the other end of the switch S214 is connected to the other end of the switch S212.

The switch S223 is connected between the capacitors C212 and C214 and the node N23. In an example, the one end of the switch S223 is connected to the other of the two electrodes of the capacitor C212 and to the one of the two electrodes of the capacitor C214. Meanwhile, the other end of the switch S223 is connected to the node N23. That is, the other end of the switch S223 is connected to the other end of the switch S221.

The switch S224 is connected between the capacitors C212 and C214 and the node N22. In an example, the one end of the switch S224 is connected to the other of the two electrodes of the capacitor C212 and to the one of the two electrodes of the capacitor C214. Meanwhile, the other end of the switch S224 is connected to the node N22. That is, the other end of the switch S224 is connected to the other end of the switch S211, the other end of the switch S222, and the other end of the switch S213.

The switch S233 is connected between the capacitor C214 and the ground. In an example, the one end of the switch S233 is connected to the other of the two electrodes of the capacitor C214. Meanwhile, the other end of the switch S233 is connected to the ground. That is, the other end of the switch S233 is connected to the other end of the switch S231.

The switch S234 is connected between the capacitor C214 and the node N23. In an example, the one end of the switch S234 is connected to the other of the two electrodes of the capacitor C214. Meanwhile, the other end of the switch S234 is connected to the node N23. That is, the other end of the switch S234 is connected to the other end of the switch S221, the other end of the switch S232, and the other end of the switch S223.

The first set of switches including the switches S212, S213, S222, S223, S232, and S233 and the second set of switches including the switches S211, S214, S221, S224, S231, and S234 are turned ON and OFF in a complementary manner, based on the control signal from the digital control circuit 60. In an example, in the first phase, the first set of switches is closed, and the second set of switches is open.

Conversely, in the second phase, the first set of switches is open, and the second set of switches is closed.

For example, charging of the capacitors C210 and C220 from the capacitor C211 is executed in one of the first phase and the second phase, and charging of the capacitors C210 and C220 from the capacitor C212 is executed in the other of the first phase and the second phase. That is, the capacitors C210 and C220 are always charged from the capacitor C211 or C212. Thus, even when a current flows from the nodes N21 to N23 to the supply modulator 30 at a high speed, potential variations at the nodes N21 to N23 can be suppressed because the nodes N21 to N23 are charged at a high speed.

The switched-capacitor circuit 22, by operating in the above manner, can maintain almost equal voltages at both ends of each of the capacitors C210, C220, and C230. In an example, V21 to V23 (voltages with respect to the ground potential) satisfying $(V21-V22):(V22-V23):(V23-VG)=1:1:1$ are maintained in three nodes labeled V21 to V23.

$(V21-V22):(V22-V23):(V23-VG)$ is not limited to 1:1:1 and may be designed to be any ratio, such as 3:2:1, 4:2:1, 1:2:3, or 1:2:4.

1.3.3 Circuit Configuration of Supply modulator 30

Still referring to FIG. 4, an exemplary circuit configuration of the supply modulator 30 can be provided. The supply modulator 30 includes input terminals 301 to 305, switches S51 to S55, and an output terminal 307.

The input terminals 301 to 305 are examples of a plurality of third input terminals and are terminals for receiving the plurality of discrete voltages (e.g., V11 and V12) generated by the switched-capacitor circuit 21 and the plurality of discrete voltages (e.g., V21 to V23) generated by the switched-capacitor circuit 22. The input terminals 301 and 302 are connected to the output terminals 213 and 214 of the switched-capacitor circuit 21, respectively, outside the supply modulator 30 and are connected to the switches S51 and S52, respectively, Inside the supply modulator 30. The input terminals 303 to 305 are connected to the output terminals 223 to 225 of the switched-capacitor circuit 22, respectively, outside the supply modulator 30 and are connected to the switches S53 to S55, respectively, inside the supply modulator 30.

The output terminal 307 is an example of a third output terminal and is a terminal for selectively supplying at least one of the plurality of discrete voltages to the power amplifier 2. The output terminal 307 is connected to the power amplifier 2 outside the supply modulator 30 and is connected to the switches S51 to S55 inside the supply modulator 30.

The switch S51 is connected between the input terminal 301 and the output terminal 307. In this connection configuration, ON/OFF switching of the switch S51 using the control signal from the digital control circuit 60 enables switching between connection and disconnection between the input terminal 301 and the output terminal 307.

The switch S52 is connected between the input terminal 302 and the output terminal 307. In this connection configuration, ON/OFF switching of the switch S52 using the control signal from the digital control circuit 60 enables switching between connection and disconnection between the input terminal 302 and the output terminal 307.

The switch S53 is connected between the input terminal 303 and the output terminal 307. In this connection configuration, ON/OFF switching of the switch S53 using the control signal from the digital control circuit 60 enables switching between connection and disconnection between the input terminal 303 and the output terminal 307.

The switch S54 is connected between the input terminal 304 and the output terminal 307. In this connection configuration, ON/OFF switching of the switch S54 using the control signal from the digital control circuit 60 enables switching between connection and disconnection between the input terminal 304 and the output terminal 307.

The switch S55 is connected between the input terminal 305 and the output terminal 307. In this connection configuration, ON/OFF switching of the switch S55 using the control signal from the digital control circuit 60 enables switching between connection and disconnection between the input terminal 305 and the output terminal 307.

In the present embodiment, the switches S51 to S55 are controlled to be exclusively ON. That is, only one of the switches S51 to S55 is controlled to be closed, and all of the rest of the switches S51 to S55 are controlled to be open. Accordingly, the supply modulator 30 can supply one voltage selected from the plurality of discrete voltages (e.g., V11, V12, and V21 to V23) to the power amplifier 2.

The configuration of the supply modulator 30 illustrated in FIG. 4 is illustrative and is not restrictive. Particularly, the switches S51 to S55 may have any configuration and be controlled in any manner as long as at least one of the five input terminals 301 to 305 can be selectively connected to the output terminal 307. For example, two of the switches S51 to S55 may be closed, and three of the rest of the switches S51 to S55 may be open. In addition, one of the input terminals 301 and 303 may be omitted. In this case, one of the switches S51 and S53 may also be omitted.

1.3.4 Circuit Configuration of Digital Control Circuit 60

As shown in FIG. 5, an exemplary circuit configuration of the digital control circuit 60 can be shown. The digital control circuit 60 includes a first controller 61, a second controller 62, and control terminals 601 to 605.

The first controller 61 can generate the control signal for controlling the switched-capacitor circuits 21 and 22 by processing a serial data signal supplied from the RFIC 5 through the control terminals 601 and 602. For example, a source-synchronous digital control signal is used as the serial data signal. ON/OFF switching of the switches S111 to S114 and S121 to S124 included in the switched-capacitor circuit 21 and the switches S211 to S214, S221 to S224, and S231 to S234 included in the switched-capacitor circuit 22 are controlled using the control signal from the first controller 61.

According to an exemplary aspect, a clock-embedded digital control signal may also be used as the serial data signal. In addition, the first controller 61 may generate the control signal for controlling the supply modulator 30.

In addition, while one set of a clock signal and a data signal is shared by the switched-capacitor circuits 21 and 22 in the present embodiment, the present disclosure is not limited thereto. For example, one set of the clock signal and the data signal may be individually used by the switched-capacitor circuits 21 and 22.

The second controller 62 can generate the control signal for controlling the supply modulator 30 by processing a parallel data signal supplied from the RFIC 5 through the control terminals 603 to 605. For example, digital control logic/line (DCL) signals (e.g., DCL1 to DCL3) are used as the parallel data signal. The DCL signals (e.g., DCL1 to DCL3) are generated by the RFIC 5 based on the envelope signal of the radio frequency signal. ON/OFF switching of the switches S51 to S55 included in the supply modulator 30 are controlled using the control signal from the second controller 62.

Each of the DCL signals (e.g., DCL1 to DCL3) is a 1-bit signal. Each of V11, V12, V21, V22, and V23 is represented by a combination of two 1-bit signals. For example, V11, V12, V21, V22, and V23 are represented by "000", "001", "010", "011", and "100", respectively. A gray code may be used for representing the voltage level.

While three DCL signals are used for controlling the supply modulator 30 in the present embodiment, the number of DCL signals is not limited thereto. For example, any number of DCL signals of one or three or more may be used in accordance with the number of voltage levels each selectable by the supply modulator 30. In addition, the parallel data signal used for controlling the supply modulator 30 is not limited to DCL signals.

1.4 Voltage Supply Method

Figure 6:
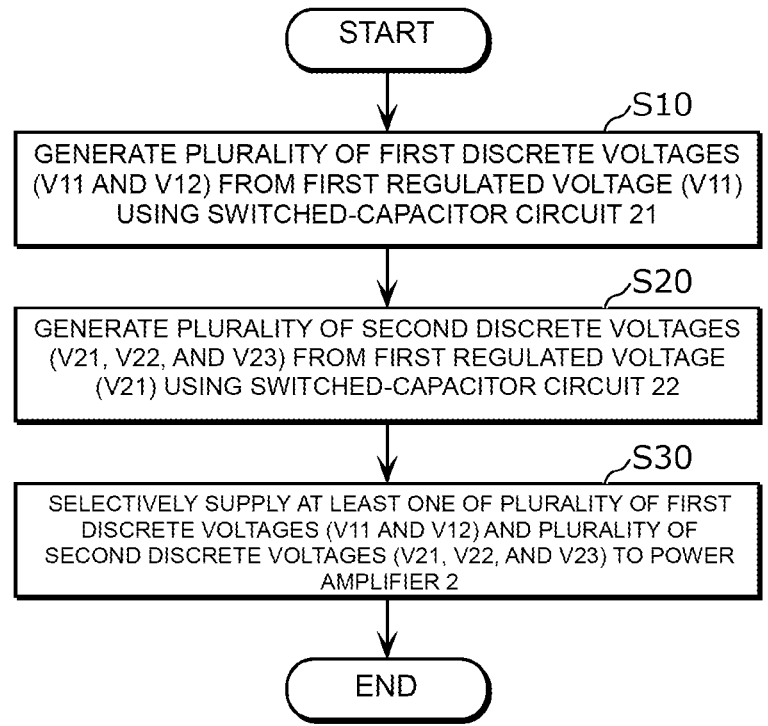
FIG. 6 is a flowchart illustrating a voltage supply method according to the exemplary Embodiment 1.

As shown in FIG. 6, an exemplary voltage supply method according to the present embodiment (or first embodiment) can be provided. In an example, FIG. 6 is a flowchart illustrating the voltage supply method that is operated based on a tracker circuit, such as the tracker circuit shown in FIGS. 4-5 according to the present embodiment (or first embodiment).

As shown in FIG. 6, at step S10, the plurality of first discrete voltages (e.g., V11 and V12) are generated from the first regulated voltage (e.g., V11) using a switched-capacitor circuit, such as the switched-capacitor circuit 21. At step S20, the plurality of second discrete voltages (e.g., V21 to V23) are generated from the first regulated voltage (e.g., V21) using a switched-capacitor circuit, such as the switched-capacitor circuit 22.

In an example, the plurality of first discrete voltages (e.g., V11 and V12) include a voltage (e.g., V12) having a level different from a level of any of the plurality of second discrete voltages (e.g., V21 to V23). In addition, the plurality of second discrete voltages (e.g., V21 to V23) include a voltage (e.g., V22 and/or V23) having a level different from a level of any of the plurality of first discrete voltages (e.g., V11 and V12). That is, the plurality of first discrete voltages is not a subset of the plurality of second discrete voltages, and the plurality of second discrete voltages are not a subset of the plurality of first discrete voltages.

At step S30, at least one of the plurality of first discrete voltages (e.g., V11 and V12) and the plurality of second discrete voltages (e.g., V21 to V23) is selectively supplied to a power amplifier (e.g., the power amplifier 2) using a supply modulator, such as the supply modulator 30. That is, at least one voltage is selected from the plurality of first discrete voltages (e.g., V11 and V12) and from the plurality of second discrete voltages (e.g., V21 to V23), and the selected at least one voltage is supplied to the power amplifier 2. The D-ET mode is applied to the power amplifier 2 by performing such voltage selection based on the envelope signal.

1.5 Plurality of Discrete Voltages

Figure 7:
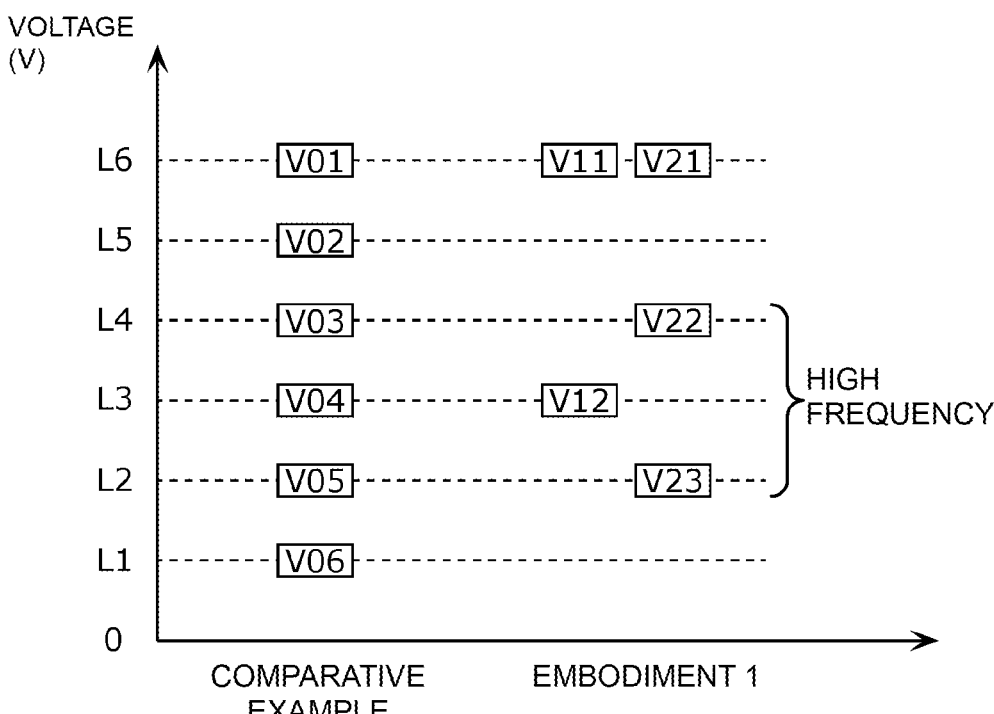
FIG. 7 is a diagram illustrating a plurality of discrete voltages that can be supplied in Embodiment 1 and in a comparative example.

FIG. 7 is an exemplary diagram illustrating a plurality of discrete voltages that can be supplied in the present embodiment (or first embodiment) and in a comparative example.

In the comparative example, six discrete voltages are generated using a ladder switched-capacitor circuit. In this case, the six discrete voltages (e.g., V01 to V06) are disposed at even level intervals between a level L6 and a ground level, and only three voltages (e.g., V03 to V05) of the six discrete voltages (e.g., V01 to V06) are included in a voltage range of L2 to L4 (hereinafter, referred to as a high frequency range) suitable for improving power-added efficiency in power having a higher frequency of occurrence near the average power of the radio frequency signal.

Meanwhile, in the present embodiment, two first discrete voltages (e.g., V11 and V12) are generated using the ladder switched-capacitor circuit 21, and three second discrete voltages (e.g., V21 to V23) are generated using the ladder switched-capacitor circuit 22. In this case, the five discrete voltages (e.g., V11, V12, and V21 to V23) are disposed at uneven level intervals between the level L6 and the ground level, and three voltages (e.g., V12, V22, and V23) of the five discrete voltages (e.g., V11, V12, and V21 to V23) are included in the high frequency range in FIG. 7.

A large number of discrete voltages included in the high frequency range enables a supply of a voltage to be more suitable for a power having a high frequency of occurrence. Accordingly, the supply of the voltage is effective for improving power-added efficiency of the power amplifier 2. In addition, a voltage (e.g., the level L6 in FIG. 7) for the maximum power is also configured to suppress a decrease in linearity. Meanwhile, a voltage lower than the high frequency range is not very effective for improving the power-added efficiency of the power amplifier 2 but rather leads to a decrease in power efficiency of the tracker circuit 1.

In the present embodiment (or first embodiment), even in a case where a total number of the plurality of discrete voltages is reduced compared to that in the comparative example, reduction of the number of voltages included in the high frequency range can be suppressed, and the power efficiency of the tracker circuit 1 can be improved. In addition, in the present embodiment, the total number of the plurality of discrete voltages can be reduced compared to that in the comparative example, and this can contribute to improvement of the power efficiency of the tracker circuit 1 and size reduction of the tracker circuit 1.

That is, in the present embodiment (or first embodiment), the number of voltages included in the high frequency range with respect to the total number of the plurality of discrete voltages can be relatively increased, and improvement of the power efficiency of the entire system can be achieved while size increase of the tracker circuit 1 is suppressed.

In the present embodiment (or first embodiment), the two first discrete voltages (e.g., V11 and V12) are generated from the regulated voltage (e.g., V11) by the ladder switched-capacitor circuit 21, and the three second discrete voltages (e.g., V21 to V23) are generated from the regulated voltage (e.g., V21) having the same level as the regulated voltage (e.g., V11) by the ladder switched-capacitor circuit 22. However, a combination of the number of the plurality of first discrete voltages (hereinafter, referred to as a first number) and the number of the plurality of second discrete voltages (hereinafter, referred to as a second number) is not limited to a combination of two and three. The combination of the first number and the second number may be any combination when a predetermined condition as follows is satisfied:

(i) The first number is not a divisor of the second number, and (ii) the second number is not a divisor of the first number.

When the plurality of first discrete voltages and the plurality of second discrete voltages are generated from the regulated voltages having the same level by two ladder switched-capacitor circuits, satisfying the predetermined condition enables the plurality of first discrete voltages to include a voltage having a level different from a level of any of the plurality of second discrete voltages and enables the plurality of second discrete voltages to include a voltage having a level different from a level of any of the plurality of first discrete voltages.

1.6 Effect

As described above in FIGS. 2-7, the tracker circuit 1 according to the present embodiment (or first embodiment) includes the switched-capacitor circuit 21 configured to generate the plurality of first discrete voltages (for example, V11 and V12), the switched-capacitor circuit 22 configured to generate the plurality of second discrete voltages (for example, V21 to V23), and the supply modulator 30 configured to selectively output at least one of the plurality of first discrete voltages (for example, V11 and V12) and the plurality of second discrete voltages (for example, V21 to V23) to the power amplifier 2. The plurality of first discrete voltages (for example, V11 and V12) include a voltage (for example, V12) having a level different from a level of any of the plurality of second discrete voltages (for example, V21 to V23). The plurality of second discrete voltages (for example, V21 to V23) include a voltage (for example, V22 and V23) having a level different from a level of any of the plurality of first discrete voltages (for example, V11 and V12).

According to another exemplary aspect of the disclosure, the tracker circuit 1 according to the present embodiment (or first embodiment) includes the switched-capacitor circuit 21 including the input terminal 211 and the plurality of output terminals 213 and 214 that output the plurality of respective first discrete voltages (for example, V11 and V12), the switched-capacitor circuit 22 including the input terminal 221 and the plurality of output terminals 223 to 225 that output the plurality of respective second discrete voltages (for example, V21 to V23), and the supply modulator 30 including the plurality of input terminals 301 to 305 connected to the plurality of output terminals 213, 214, and 223 to 225, respectively, and the output terminal 307 connected to the power amplifier 2. The plurality of first discrete voltages (for example, V11 and V12) include a voltage (for example, V12) having a level different from a level of any of the plurality of second discrete voltages (for example, V21 to V23). The plurality of second discrete voltages (for example, V21 to V23) include a voltage (for example, V22 and V23) having a level different from a level of any of the plurality of first discrete voltages (for example, V11 and V12).

According to this configuration of the first embodiment, by generating the plurality of first discrete voltages (for example, V11 and V12) via the switched-capacitor circuit 21 and generating the plurality of second discrete voltages (for example, V21 to V23) via the switched-capacitor circuit 22, the plurality of discrete voltages (for example, V11, V12, and V21 to V23) can be generated at uneven level intervals. Accordingly, a large number of discrete voltages can be generated in a voltage range (e.g., a high frequency range) suitable for the power having a higher frequency of occurrence near the average power of the radio frequency signal while an increase in the total number of the plurality of discrete voltages is suppressed. Consequently, in the D-ET mode, voltages can be finely regulated with respect to the power having a higher frequency of occurrence, and the power-added efficiency of the power amplifier 2 can be improved. Furthermore, by suppressing an increase in the total number of the plurality of discrete voltages, a decrease in the power efficiency of the tracker circuit 1 can be suppressed.

In addition, for example, in the tracker circuit 1 according to the present embodiment (or first embodiment), the switched-capacitor circuit 21 may be configured to generate the plurality of first discrete voltages (for example, V11 and V12) from the first regulated voltage (for example, V11). The switched-capacitor circuit 22 may be configured to generate the plurality of second discrete voltages (for example, V21 to V23) from the first regulated voltage (for example, V21=V11). The combination of the first number (for example, two) which is the number of the plurality of first discrete voltages (for example, V11 and V12) and the second number (for example, three) which is the number of the plurality of second discrete voltages (for example, V21 to V23) may satisfy the predetermined condition. The predetermined condition may be (i) the first number (for example, two) is not a divisor of the second number (for example, three) and (ii) the second number (for example, three) is not a divisor of the first number (for example, two). It is noted that for purposes of this disclosure, the term "divisor" means number that divides into another without a remainder.

According to another exemplary aspect of the disclosure, in the tracker circuit 1 according to the present embodiment (or first embodiment), the input terminals 211 and 221 may receive the first regulated voltage (for example, V11=V21). The combination of the first number (for example, two) which is the number of the plurality of first discrete voltages (for example, V11 and V12) and the second number (for example, three) which is the number of the plurality of second discrete voltages (for example, V21 to V23) may satisfy the predetermined condition. The predetermined condition may be (i) the first number (for example, two) is not a divisor of the second number (for example, three) and (ii) the second number (for example, three) is not a divisor of the first number (for example, two).

According to this configuration of the first embodiment, the plurality of discrete voltages (for example, V11, V12, and V21 to V23) can be generated from the regulated voltages having the same level (for example, V11=V21) at uneven level intervals by the two ladder switched-capacitor circuits 21 and 22. Accordingly, the power-added efficiency of the power amplifier 2 can be improved while a decrease in the power efficiency of the tracker circuit 1 is suppressed. Furthermore, since the regulated voltages having a single level may be supplied to the switched-capacitor circuits 21 and 22, the configuration of the pre-regulator circuit 10 can be simplified.

In addition, the communication device 7 according to the present embodiment includes the tracker circuit 1, the RFIC 5 configured to process the radio frequency signal, and the radio frequency circuit 4 that includes the power amplifier 2 and that is configured to transmit the radio frequency signal between the RFIC 5 and the antenna 6.

According to this configuration of the first embodiment, the same effect as the tracker circuit 1 can be implemented in the communication device 7, and this is effective for reducing power consumption.

In addition, the voltage supply method shown in FIG. 6 according to the present embodiment (or first embodiment) includes generating the plurality of first discrete voltages (for example, V11 and V12) using the switched-capacitor circuit 21 at step S10, generating the plurality of second discrete voltages (for example, V21 to V23) using the switched-capacitor circuit 22 at step S20, and selectively outputting at least one of the plurality of first discrete voltages (for example, V11 and V12) and the plurality of second discrete voltages (for example, V21 to V23) to the power amplifier 2 at step S30. The plurality of first discrete voltages (for example, V11 and V12) include a voltage (for example, V12) having a level different from a level of any of the plurality of second discrete voltages (for example, V21 to V23). The plurality of second discrete voltages (for example, V21 to V23) include a voltage (for example, V22 and V23) having a level different from a level of any of the plurality of first discrete voltages (for example, V11 and V12).

According to this configuration of the first embodiment, by generating the plurality of first discrete voltages (for example, V11 and V12) via the switched-capacitor circuit 21 and generating the plurality of second discrete voltages (for example, V21 to V23) via the switched-capacitor circuit 22, the plurality of discrete voltages (for example, V11, V12, and V21 to V23) can be generated at uneven level intervals. Accordingly, a large number of discrete voltages can be generated in a voltage range (e.g., a high frequency range) suitable for the power having a higher frequency of occurrence near the average power of the radio frequency signal while an increase in the total number of the plurality of discrete voltages is suppressed. Consequently, in the D-ET mode, voltages can be finely regulated with respect to the power having a higher frequency of occurrence, and the power-added efficiency of the power amplifier 2 can be improved. Furthermore, by suppressing an increase in the total number of the plurality of discrete voltages, a decrease in the power efficiency of the tracker circuit 1 can be suppressed.

In addition, in the voltage supply method according to the present embodiment (or first embodiment), the plurality of first discrete voltages (for example, V11 and V12) and the plurality of second discrete voltages (for example, V21 to V23) may be generated from the regulated voltages having the same level (for example, V11=V21). The combination of the first number (for example, two) which is the number of the plurality of first discrete voltages (for example, V11 and V12) and the second number (for example, three) which is the number of the plurality of second discrete voltages (for example, V21 to V23) may satisfy the predetermined condition. The predetermined condition may be (i) the first number (for example, two) is not a divisor of the second number (for example, three) and (ii) the second number (for example, three) is not a divisor of the first number (for example, two).

According to this configuration of the first embodiment, the plurality of discrete voltages (for example, V11, V12, and V21 to V23) can be generated from the regulated voltages having the same level (for example, V11=V21) at uneven level intervals by the two ladder switched-capacitor circuits 21 and 22. Accordingly, the power-added efficiency of the power amplifier 2 can be improved while a decrease in the power efficiency of the tracker circuit 1 is suppressed. Furthermore, since the regulated voltages having a single level may be supplied to the switched-capacitor circuits 21 and 22, the configuration of the pre-regulator circuit 10 can be simplified.

In an exemplary aspect, a second embodiment (or Embodiment 2) of the disclosure can be provided in FIGS. 8-11.

In an example, the second embodiment (or Embodiment 2) is different from the first embodiment (or Embodiment 1) in that regulated voltages with different levels are used by two switched-capacitor circuits. In an example, aspects of the second embodiment different from Embodiment 1 can be described with reference to the FIGS. 8-11.

The communication device 7 according to the present embodiment (or second embodiment) is the same as the communication device 7 according to Embodiment 1 except that a pre-regulator circuit 10A and a tracker circuit 1A are provided instead of the pre-regulator circuit 10 and the tracker circuit 1. Accordingly, the pre-regulator circuit 10A and the tracker circuit 1A can be described below, and illustration and description of other circuits can be omitted, as appropriate.

2.1 Circuit Configuration of Pre-Regulator Circuit 10A

Figure 8:
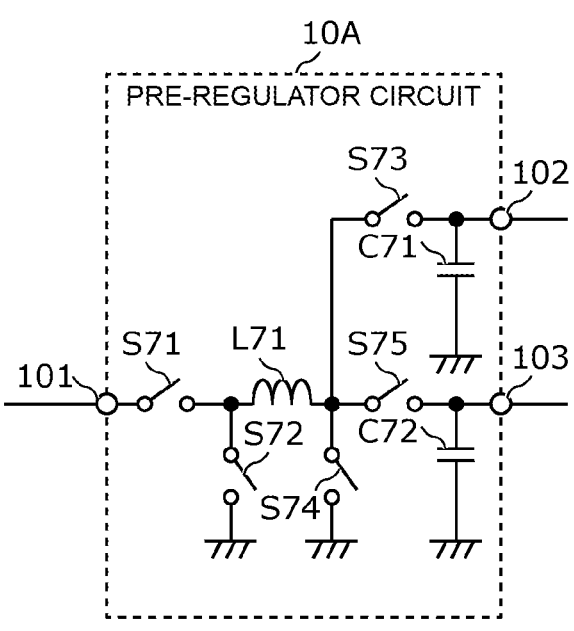
FIG. 8 is a circuit configuration diagram of a pre-regulator circuit according to an exemplary Embodiment 2.

A circuit configuration of the pre-regulator circuit 10A can be described with reference to FIG. 8. FIG. 8 is a circuit configuration diagram of the pre-regulator circuit 10A according to the present embodiment (or second embodiment).

FIG. 8 is an exemplary circuit configuration, and the pre-regulator circuit 10A may be mounted using any of various circuit mounting methods and circuit technologies. Accordingly, description of the pre-regulator circuit 10A provided below is exemplary and is not to be interpreted as being limiting.

The pre-regulator circuit 10A is an example of a converter circuit and includes the input terminal 101, output terminals 102 and 103, switches S71 to S75, the power inductor L71, and capacitors C71 and C72.

The input terminal 101 is an example of a fourth input terminal and is a terminal for receiving the direct current voltage from the direct current power source 50. The input terminal 101 is connected to the direct current power source 50 outside the pre-regulator circuit 10A and is connected to the switch S71 inside the pre-regulator circuit 10A.

The output terminal 102 is an example of a fourth output terminal and is a terminal for supplying the regulated voltage (e.g., V11) to the switched-capacitor circuit 21. The output terminal 102 is connected to the input terminal 211 of the switched-capacitor circuit 21 outside the pre-regulator circuit 10A and is connected to the switch S73 inside the pre-regulator circuit 10A.

The output terminal 103 is an example of the fourth output terminal and is a terminal for supplying the regulated voltage (e.g., V21) to a switched-capacitor circuit 22A. The output terminal 103 is connected to the input terminal 221 of the switched-capacitor circuit 22A outside the pre-regulator circuit 10A and is connected to the switch S75 inside the pre-regulator circuit 10A.

The switch S75 is connected between the other end of the power inductor L71 and the output terminal 103. In this connection configuration, ON/OFF switching of the switch S75 enables switching between connection and disconnection between the other end of the power inductor L71 and the output terminal 103.

The capacitor C72 is connected between the ground and a path between the switch S75 and the output terminal 103. In an example, one of two electrodes of the capacitor C72 is connected to the switch S75 and to the output terminal 103, and the other of the two electrodes of the capacitor C72 is connected to the ground.

The configuration of the pre-regulator circuit 10A illustrated in FIG. 8 is illustrative and is not restrictive. For example, a part of the switches S71 to S75 may be replaced with a diode. In addition, a part or the entirety of the pre-regulator circuit 10A may be included in the tracker circuit 1A. In addition, the pre-regulator circuit 10A may be replaced with two pre-regulator circuits 10.

2.2 Circuit Configuration of Tracker Circuit 1A

Figure 9:
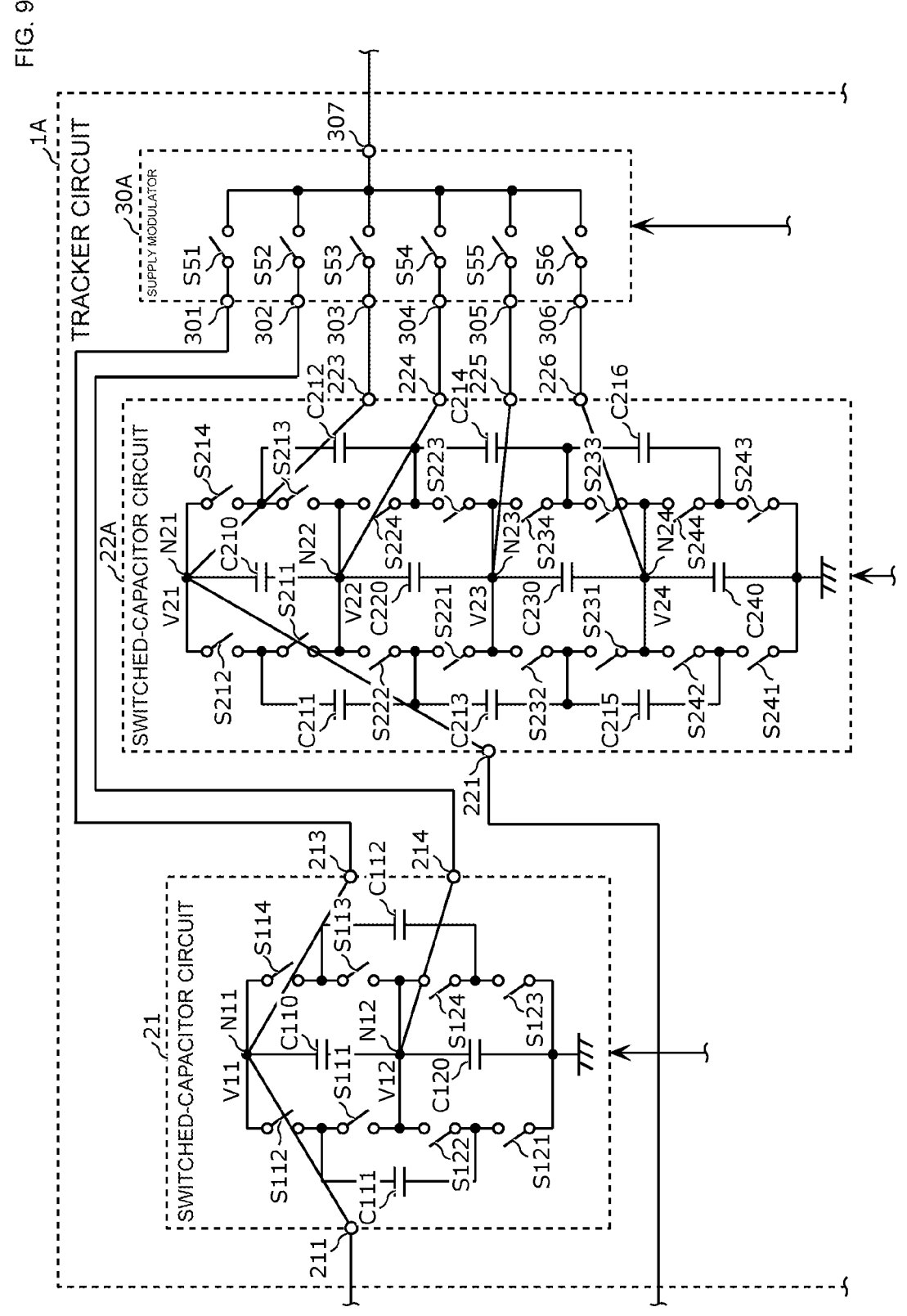
FIG. 9 is a partial circuit configuration diagram of a tracker circuit according to the exemplary Embodiment 2.

In an example, a circuit configuration of the tracker circuit 1A can be described with reference to FIG. 9. FIG. 9 is a partial circuit configuration diagram of the tracker circuit 1A according to the present embodiment.

FIG. 9 is an exemplary circuit configuration, and the tracker circuit 1A may be mounted using any of various circuit mounting methods and circuit technologies. Accordingly, description of the tracker circuit 1A provided below is not to be interpreted as being limiting.

The tracker circuit 1A is the same as the tracker circuit 1 according to Embodiment 1 except that the switched-capacitor circuit 22A and a supply modulator 30A are provided instead of the switched-capacitor circuit 22 and the supply modulator 30. Accordingly, circuit configurations of the switched-capacitor circuit 22A and the supply modulator 30A can be described below.

2.2.1 Circuit Configuration of Switched-Capacitor Circuit 22A

The switched-capacitor circuit 22A is an example of the second switched-capacitor circuit and has a ladder circuit configuration. In an example, the switched-capacitor circuit 22A includes capacitors C210 to C216, C220, C230, and C240, switches S211 to S214, S221 to S224, S231 to S234, and S241 to S244, the input terminal 221, and output terminals 223 to 226. Energy and charges are input into the node N21 from the pre-regulator circuit 10A through the input terminal 221 and are output to the supply modulator 30A from nodes N21 to N24 through the output terminals 223 to 226.

The regulated voltage (e.g., V21) is an example of the first regulated voltage and is supplied from the pre-regulator circuit 10A. In the present embodiment, the regulated voltage (e.g., V21) has a level different from a level of the regulated voltage (e.g., V11).

The output terminal 226 is an example of the second output terminal and is a terminal for supplying an output voltage (e.g., V24) to the supply modulator 30A. The output terminal 226 is connected to the supply modulator 30A outside the switched-capacitor circuit 22A and is connected to the node N24 inside the switched-capacitor circuit 22A.

The output voltage (e.g., V24) is an example of the voltage included in the plurality of second discrete voltages and is generated from the regulated voltage (e.g., V21). In the present embodiment, the output voltage (e.g., V24) is lower than the output voltage (e.g., V23).

The capacitors C215 and C216 are flying capacitors and are used for raising and/or lowering the regulated voltage (e.g., V21) supplied from the switched-capacitor circuit 21. In an example, the capacitors C215 and C216 cause charges to move between the capacitors C215 and C216 and the nodes N23 and N24 and the ground such that V23 and V24 satisfying (V23−V24):(V24−VG)=1:1 and V23>V24 are maintained in the two nodes N23 and N24.

One of two electrodes of the capacitor C215 is connected to one end of the switch S231 and to one end of the switch S232. The other of the two electrodes of the capacitor C215 is connected to one end of the switch S241 and to one end of the switch S242.

One of two electrodes of the capacitor C216 is connected to one end of the switch S233 and to one end of the switch S234. The other of the two electrodes of the capacitor C216 is connected to one end of the switch S243 and to one end of the switch S244.

The capacitor C240 is a smoothing capacitor and is used for holding and smoothing the output voltage (e.g., V24) in the node N24. The capacitor C240 is connected between the node N24 and the ground. In an example, one of two electrodes of the capacitor C240 is connected to the node N24. Meanwhile, the other of the two electrodes of the capacitor C240 is connected to the ground.

The switch S241 is connected between the capacitor C215 and the ground. In an example, the one end of the switch S241 is connected to the other of the two electrodes of the capacitor C215. Meanwhile, the other end of the switch S241 is connected to the ground.

The switch S242 is connected between the capacitor C215 and the node N24. In an example, the one end of the switch S242 is connected to the other of the two electrodes of the capacitor C215. Meanwhile, the other end of the switch S242 is connected to the node N24.

The switch S243 is connected between the capacitor C216 and the ground. In an example, the one end of the switch S243 is connected to the other of the two electrodes of the capacitor C216. Meanwhile, the other end of the switch S243 is connected to the ground.

The switch S244 is connected between the capacitor C216 and the node N24. In an example, the one end of the switch S244 is connected to the other of the two electrodes of the capacitor C216. Meanwhile, the other end of the switch S244 is connected to the node N24.

The first set of switches including the switches S212, S213, S222, S223, S232, S233, S242, and S243 and a second set of switches including the switches S211, S214, S221, S224, S231, S234, S241, and S244 are turned ON and OFF in a complementary manner, based on the control signal from the digital control circuit 60. In an example, in the first phase, the first set of switches is closed, and the second set of switches is open. Conversely, in the second phase, the first set of switches is open, and the second set of switches is closed.

The switched-capacitor circuit 22A, by operating in the above manner, can maintain almost equal voltages at both ends of each of the capacitors C210 to C240. In an example, V21 to V24 (voltages with respect to the ground potential) satisfying (e.g., V21−V22):(V22−V23):(V23−V24):(V24−VG)=1:1:1:1 are maintained in four nodes labeled V21 to V24.

(V21−V22):(V22−V23):(V2−V24):(V2−VG) is not limited to 1:1:1:1 and may be designed to be any ratio (for example, 1:2:4:8 or 8:4:2:1).

2.2.2 Circuit Configuration of Supply modulator 30A

In an example, a circuit configuration of the supply modulator 30A can be described with reference to FIG. 9. The supply modulator 30A includes input terminals 301 to 306, switches S51 to S56, and the output terminal 307.

The input terminal 306 is an example of the third input terminal and is a terminal for receiving the output voltage (e.g., V24) generated by the switched-capacitor circuit 22A. The input terminal 306 is connected to the output terminal 226 of the switched-capacitor circuit 22A outside the supply modulator 30A and is connected to the switch S56 inside the supply modulator 30A.

The switch S56 is connected between the input terminal 306 and the output terminal 307. In this connection configuration, ON/OFF switching of the switch S56 using the control signal from the digital control circuit 60 enables switching between connection and disconnection between the input terminal 306 and the output terminal 307.

In the present embodiment, the switches S51 to S56 are controlled to be exclusively ON. That is, only one of the switches S51 to S56 is controlled to be closed, and all of the rest of the switches S51 to S56 are controlled to be open. Accordingly, the supply modulator 30A can supply one voltage selected from the plurality of discrete voltages (e.g., V11, V12, and V21 to V24) to the power amplifier 2.

The configuration of the supply modulator 30A illustrated in FIG. 9 is illustrative and is not restrictive. Particularly, the switches S51 to S56 may have any configuration and be controlled in any manner as long as at least one of the six input terminals 301 to 306 can be selectively connected to the output terminal 307. For example, two of the switches S51 to S56 may be closed, and four of the rest of the switches S51 to S56 may be open.

2.3 Voltage Supply Method

Figure 10:
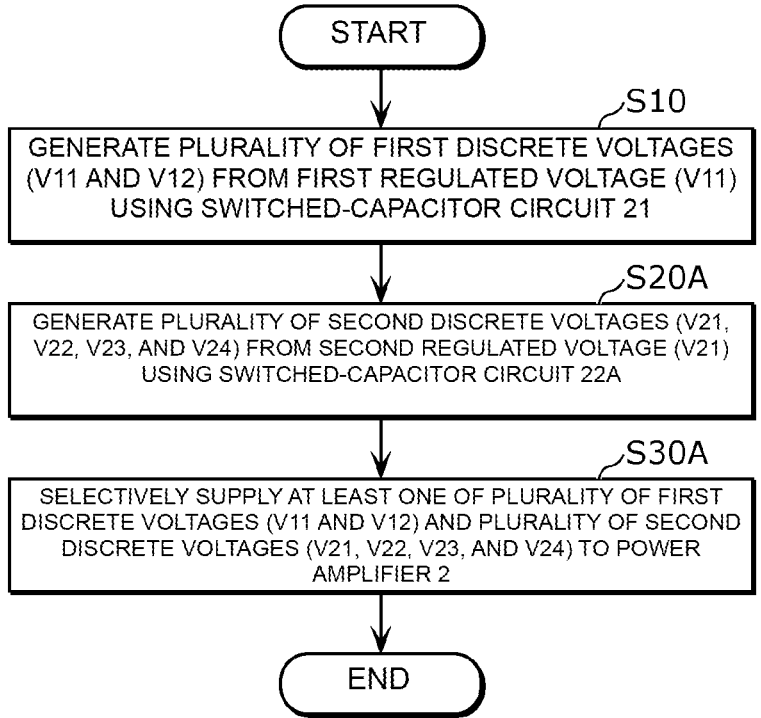
FIG. 10 is a flowchart illustrating a voltage supply method according to the exemplary Embodiment 2.

In an example, a voltage supply method according to the present embodiment (or second embodiment) can be described with reference to FIG. 10. FIG. 10 is a flowchart illustrating the voltage supply method according to the present embodiment.

As shown in FIG. 10, at step S10, the plurality of first discrete voltages (e.g., V11 and V12) are generated from the first regulated voltage (V11) using the switched-capacitor circuit 21. At step (S20A), the plurality of second discrete voltages (e.g., V21 to V24) are generated from a second regulated voltage (e.g., V21) using the switched-capacitor circuit 22A.

In an example of step S20A, the plurality of first discrete voltages (e.g., V11 and V12) include a voltage (for example, V11 and/or V12) having a level different from a level of any of the plurality of second discrete voltages (e.g., V21 to V24). In addition, the plurality of second discrete voltages (e.g., V21 to V24) include a voltage (for example, V21 to V24 or any combination thereof) having a level different from a level of any of the plurality of first discrete voltages (e.g., V11 and V12). That is, the plurality of first discrete voltages is not a subset of the plurality of second discrete voltages, and the plurality of second discrete voltages are not a subset of the plurality of first discrete voltages.

At step (S30A), at least one of the plurality of first discrete voltages (e.g., V11 and V12) and the plurality of second discrete voltages (e.g., V21 to V24) is selectively supplied to the power amplifier 2 using the supply modulator 30A. That is, at least one voltage is selected from the plurality of first discrete voltages (e.g., V11 and V12) and from the plurality of second discrete voltages (e.g., V21 to V24), and the selected at least one voltage is supplied to the power amplifier 2. The D-ET mode is applied to the power amplifier 2 by performing such voltage selection based on the envelope signal.

Figure 11:
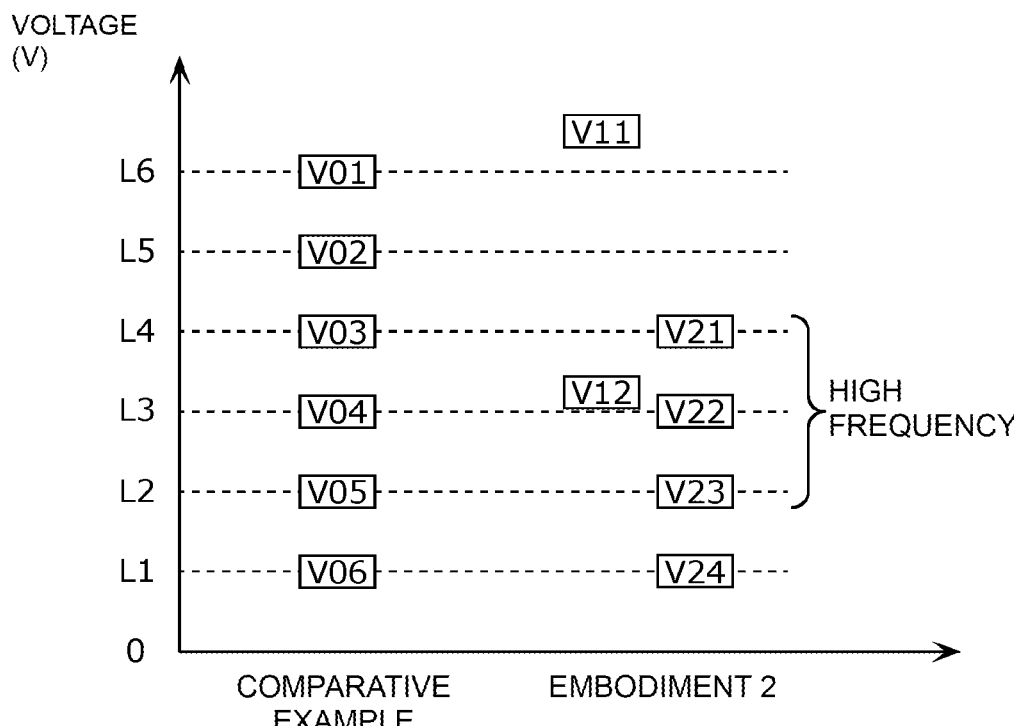
FIG. 11 is a diagram illustrating a plurality of discrete voltages that can be supplied in the exemplary Embodiment 2 and in a comparative example.

According to an exemplary aspect, the plurality of discrete voltages that can be supplied by the tracker circuit 1A according to the present embodiment (or second embodiment) can be described with reference to FIG. 11. FIG. 11 is a diagram illustrating a plurality of discrete voltages that can be supplied in the present embodiment and in a comparative example.

In the comparative example, six discrete voltages are generated using a ladder switched-capacitor circuit. In this case, the six discrete voltages (e.g., V01 to V06) are disposed at even level intervals between the level L6 and the ground level, and only three voltages (e.g., V03 to V05) of the six discrete voltages (e.g., V01 to V06) are included in the high frequency range (L2 to L4).

Meanwhile, in the present embodiment (or second embodiment), two first discrete voltages (e.g., V11 and V12) are generated from the first regulated voltage (e.g., V11) using the ladder switched-capacitor circuit 21, and four second discrete voltages (e.g., V21 to V24) are generated from the second regulated voltage (e.g., V21) using the ladder switched-capacitor circuit 22A. In this case, the six discrete voltages (e.g., V11, V12, and V21 to V24) are disposed at uneven level intervals between the level L6 and the ground level, and four voltages (e.g., V12 and V21 to V23) of the six discrete voltages (e.g., V11, V12, and V21 to V24) are included in the high frequency range in FIG. 11.

In the present embodiment (or second embodiment), the number of voltages included in the high frequency range can be increased while an increase in the total number of the plurality of discrete voltages is suppressed compared to that in the comparative example, and the power-added efficiency of the power amplifier 2 can be improved. Conversely, when the number of voltages included in the high frequency range is increased using one ladder switched-capacitor circuit as in the comparative example, the total number of the plurality of discrete voltages is increased. Accordingly, the tracker circuit 1A according to the present embodiment can contribute to improvement of the power efficiency and size reduction.

That is, in the present embodiment (or second embodiment), the number of voltages included in the high frequency range with respect to the total number of the plurality of discrete voltages can be relatively increased, and improvement of the power efficiency of the entire system can be achieved while size increase of the tracker circuit 1A is suppressed.

2.5 Effect

As described above, the tracker circuit 1A according to the present embodiment includes the switched-capacitor circuit 21 configured to generate the plurality of first discrete voltages (for example, V11 and V12), the switched-capacitor circuit 22A configured to generate the plurality of second discrete voltages (for example, V21 to V24), and the supply modulator 30A configured to selectively output at least one of the plurality of first discrete voltages (for example, V11 and V12) and the plurality of second discrete voltages (for example, V21 to V24) to the power amplifier 2. The plurality of first discrete voltages (for example, V11 and V12) include a voltage (for example, V11 and V12) having a level different from a level of any of the plurality of second discrete voltages (for example, V21 to V24). The plurality of second discrete voltages (for example, V21 to V24) include a voltage (for example, V21 to V24) having a level different from a level of any of the plurality of first discrete voltages (for example, V11 and V12).

According to another exemplary aspect of the second embodiment, the tracker circuit 1A according to the present embodiment includes the switched-capacitor circuit 21 including the input terminal 211 and the plurality of output terminals 213 and 214 that output the plurality of respective first discrete voltages (for example, V11 and V12), the switched-capacitor circuit 22A including the input terminal 221 and the plurality of output terminals 223 to 226 that output the plurality of respective second discrete voltages (for example, V21 to V24), and the supply modulator 30A including the plurality of input terminals 301 to 306 connected to the plurality of output terminals 213, 214, and 223 to 226, respectively, and the output terminal 307 connected to the power amplifier 2. The plurality of first discrete voltages (for example, V11 and V12) include a voltage (for example, V11 and V12) having a level different from a level of any of the plurality of second discrete voltages (for example, V21 to V24). The plurality of second discrete voltages (for example, V21 to V24) include a voltage (for example, V21 to V24) having a level different from a level of any of the plurality of first discrete voltages (for example, V11 and V12).

According to this configuration of the second embodiment, by generating the plurality of first discrete voltages (for example, V11 and V12) via the switched-capacitor circuit 21 and generating the plurality of second discrete voltages (for example, V21 to V24) via the switched-capacitor circuit 22A, the plurality of discrete voltages (for example, V11, V12, and V21 to V24) can be generated at uneven level intervals. Accordingly, a large number of discrete voltages can be generated in a voltage range (e.g., a high frequency range) suitable for the power having a higher frequency of occurrence near the average power of the radio frequency signal while an increase in the total number of the plurality of discrete voltages is suppressed. Consequently, in the D-ET mode, voltages can be finely regulated with respect to the power having a higher frequency of occurrence, and the power-added efficiency of the power amplifier 2 can be improved. Furthermore, by suppressing an increase in the total number of the plurality of discrete voltages, a decrease in the power efficiency of the tracker circuit 1A can be suppressed.

In addition, for example, in the tracker circuit 1A according to the present embodiment, the switched-capacitor circuit 21 may be configured to generate the plurality of first discrete voltages (for example, V11 and V12) from the first regulated voltage (for example, V11), and the switched-capacitor circuit 22A may be configured to generate the plurality of second discrete voltages (for example, V21 to V24) from the second regulated voltage (for example, V21) having a level different from a level of the first regulated voltage (for example, V11).

According to another exemplary aspect of the disclosure, in the tracker circuit 1A according to the present embodiment (or second embodiment), the input terminal 211 may receive the first regulated voltage (for example, V11), and the input terminal 221 may receive the second regulated voltage (for example, V21) having a level different from a level of the first regulated voltage (for example, V11).

According to this configuration of the second embodiment, the plurality of discrete voltages (for example, V11, V12, and V21 to V24) can be generated from the regulated voltages having levels different from each other (for example, V11/V21) at uneven level intervals by the two-ladder switched-capacitor circuits 21 and 22A. Accordingly, the power-added efficiency of the power amplifier 2 can be improved while a decrease in the power efficiency of the tracker circuit 1A is suppressed. Particularly, since the regulated voltages having levels different from each other can be used by the switched-capacitor circuits 21 and 22A, the number of combinations of the plurality of discrete voltages that can be generated by the switched-capacitor circuits 21 and 22A can be increased, and this is effective for improving the power-added efficiency of the power amplifier 2.

In addition, for example, the tracker circuit 1A according to the present embodiment may further include the pre-regulator circuit 10A that converts the input voltage into the first regulated voltage (for example, V11) and into the second regulated voltage (for example, V21).

According to this configuration of the second embodiment, two regulated voltages having levels different from each other can be generated by the pre-regulator circuit 10A.

In addition, the communication device 7 according to the present embodiment includes the tracker circuit 1A, the RFIC 5 configured to process the radio frequency signal, and the radio frequency circuit 4 that includes the power amplifier 2 and that is configured to transmit the radio frequency signal between the RFIC 5 and the antenna 6.

According to this configuration of the embodiment, the same effect as the tracker circuit 1A can be implemented in the communication device 7, and this is effective for reducing power consumption.

In addition, as shown in FIG. 10, the voltage supply method according to the present embodiment (or second embodiment) includes generating the plurality of discrete voltages (for example, V11 and V12) using the switched-capacitor circuit 21 at step S10, generating the plurality of second discrete voltages (for example, V21 to V24) using the switched-capacitor circuit 22A at step S20A, and selectively outputting at least one of the plurality of first discrete voltages (for example, V11 and V12) and the plurality of second discrete voltages (for example, V21 to V24) to the power amplifier 2 at step S30A. The plurality of first discrete voltages (for example, V11 and V12) include a voltage (for example, V11 and V12) having a level different from a level of any of the plurality of second discrete voltages (for example, V21 to V24). The plurality of second discrete voltages (for example, V21 to V24) include a voltage (for example, V21 to V24) having a level different from a level of any of the plurality of first discrete voltages (for example, V11 and V12).

According to this configuration of the second embodiment, by generating the plurality of first discrete voltages (for example, V11 and V12) via the switched-capacitor circuit 21 and generating the plurality of second discrete voltages (for example, V21 to V24) via the switched-capacitor circuit 22A, the plurality of discrete voltages (for example, V11, V12, and V21 to V24) can be generated at uneven level intervals. Accordingly, a large number of discrete voltages can be generated in a voltage range (high frequency range) suitable for the power having a higher frequency of occurrence near the average power of the radio frequency signal while an increase in the total number of the plurality of discrete voltages is suppressed. Consequently, in the D-ET mode, voltages can be finely regulated with respect to the power having a higher frequency of occurrence, and the power-added efficiency of the power amplifier 2 can be improved. Furthermore, by suppressing an increase in the total number of the plurality of discrete voltages, a decrease in the power efficiency of the tracker circuit 1A can be suppressed.

In addition, in the voltage supply method according to the present embodiment, the plurality of first discrete voltages (for example, V11 and V12) and the plurality of second discrete voltages (for example, V21 to V24) may be generated from the respective regulated voltages having levels different from each other (for example, V11≠V21).

According to this configuration of the second embodiment, the plurality of discrete voltages (for example, V11, V12, and V21 to V24) can be generated from the regulated voltages having levels different from each other (for example, V11≠V21) at uneven level intervals. Accordingly, the power-added efficiency of the power amplifier 2 can be improved while a decrease in the power efficiency of the tracker circuit 1A is suppressed. Particularly, since the regulated voltages having levels different from each other can be used by the switched-capacitor circuits 21 and 22A, the number of combinations of the plurality of discrete voltages that can be generated by the switched-capacitor circuits 21 and 22A can be increased, and this is effective for improving the power-added efficiency of the power amplifier 2.

Figure 12:
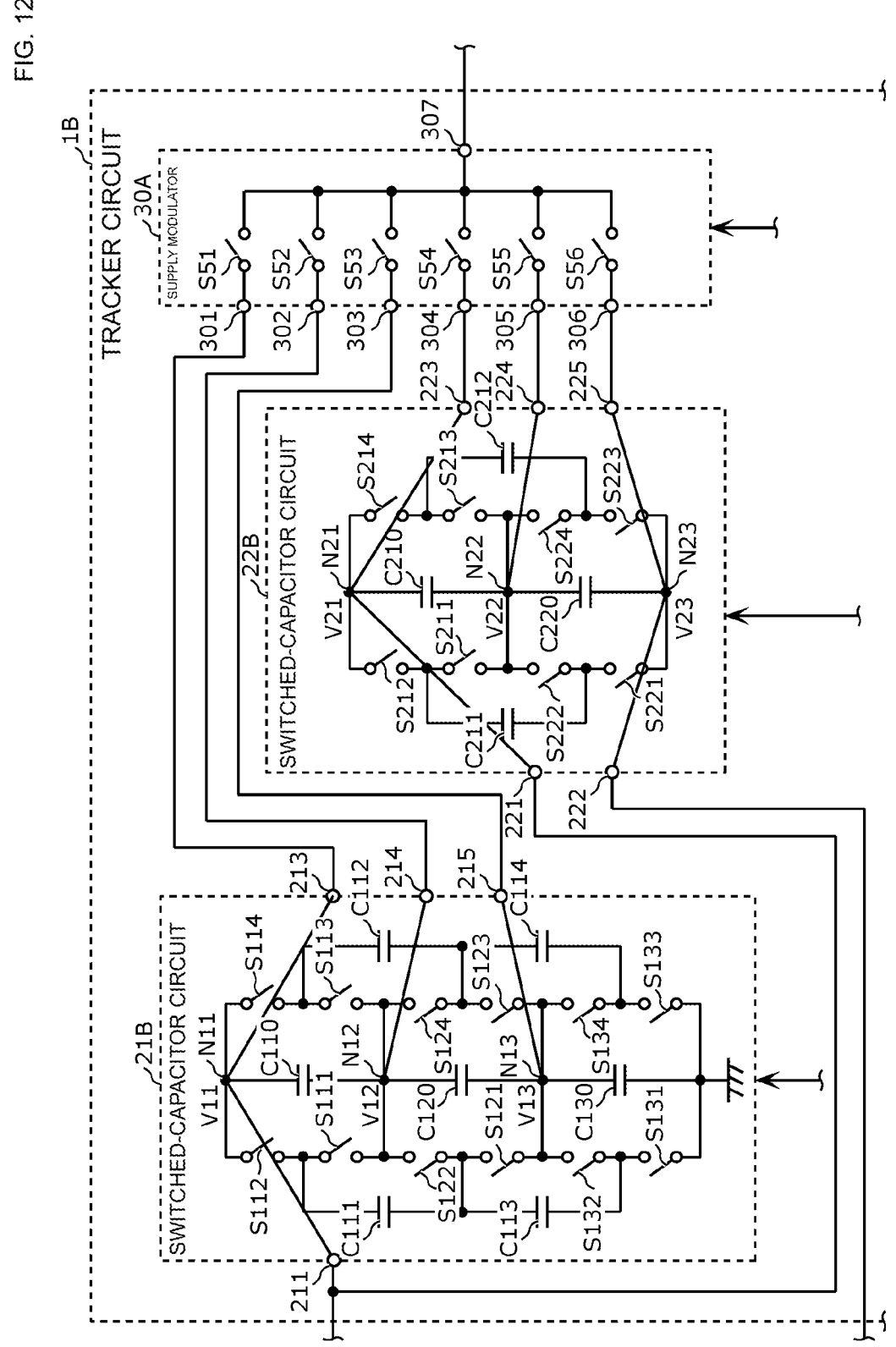
FIG. 12 is a partial circuit configuration diagram of a tracker circuit according to an exemplary Embodiment 3.
Figure 13:
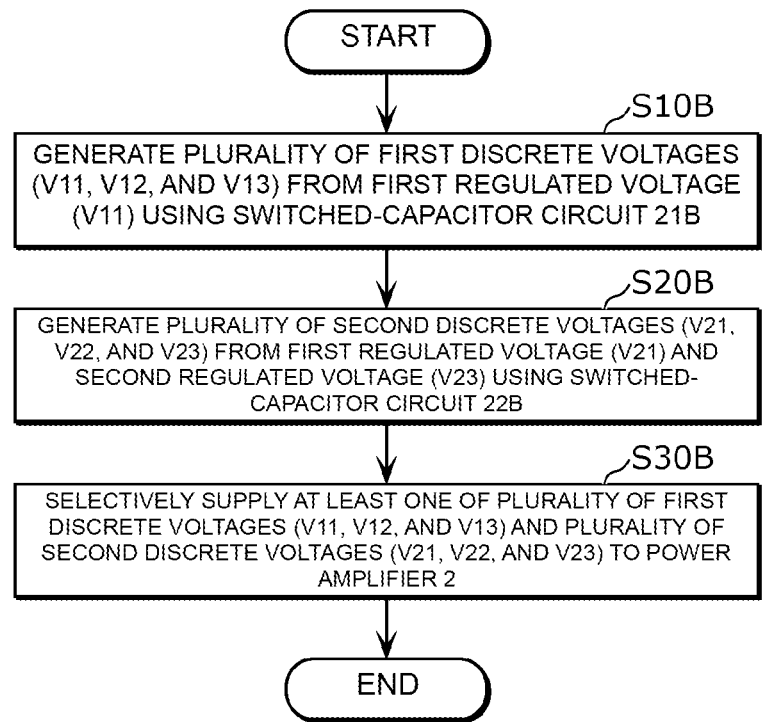
FIG. 13 is a flowchart illustrating a voltage supply method according to the exemplary Embodiment 3.
Figure 14:
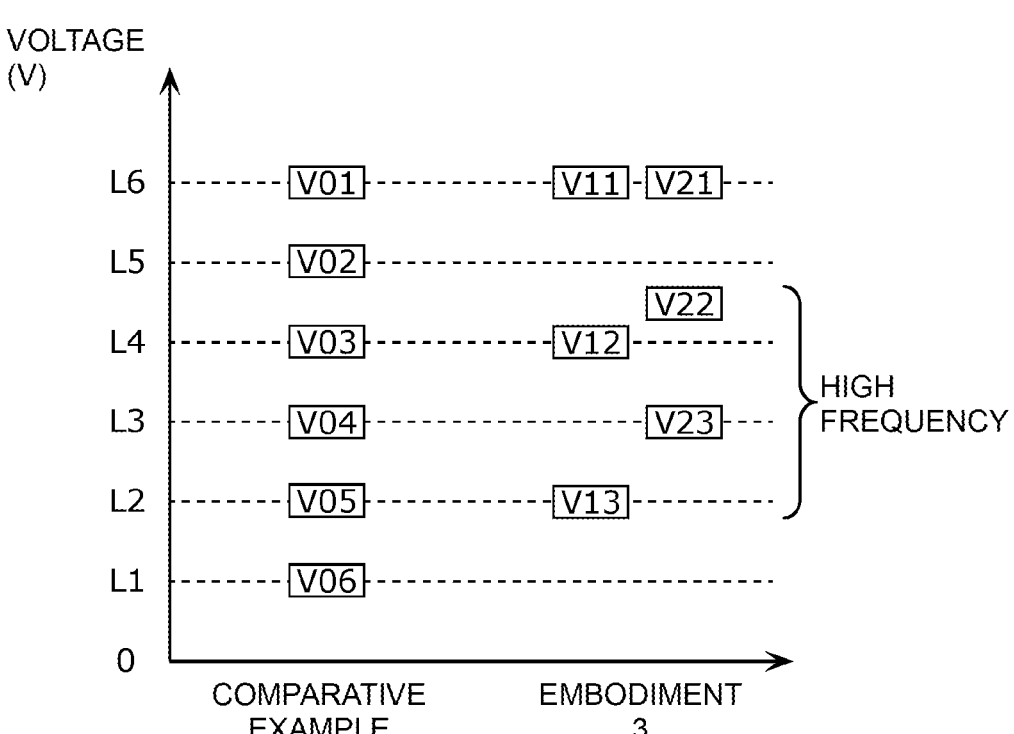
FIG. 14 is a diagram illustrating a plurality of discrete voltages that can be supplied in the exemplary Embodiment 3 and in a comparative example.

In an exemplary aspect, a third embodiment (or Embodiment 3) can be provided in FIGS. 12-14.

In an exemplary aspect, the present embodiment (or third embodiment, i.e., Embodiment 3) is mainly different from Embodiments 1 and 2 in that a differential switched-capacitor circuit is used in one of two switched-capacitor circuits. Hereinafter, aspects of the present embodiment (or third embodiment) different from Embodiments 1 and 2 can be described with reference to the FIGS. 12-14.

The communication device 7 according to the present embodiment is the same as the communication device 7 according to Embodiment 2 except that a tracker circuit 1B is provided instead of the tracker circuit 1A. Accordingly, the tracker circuit 1B will be described below, and illustration and description of other circuits will be omitted, as appropriate.

3.1 Circuit Configuration of Tracker Circuit 1B

In an example, a circuit configuration of the tracker circuit 1B will be described with reference to FIG. 12. FIG. 12 is a partial circuit configuration diagram of the tracker circuit 1B according to the present embodiment.

FIG. 12 is an exemplary circuit configuration, and the tracker circuit 1B may be mounted using any of various circuit mounting methods and circuit technologies. Accordingly, description of the tracker circuit 1B provided below is not to be interpreted as being limiting.

The tracker circuit 1B is the same as the tracker circuit 1A according to Embodiment 2 except that switched-capacitor circuits 21B and 22B are provided instead of the switched-capacitor circuits 21 and 22A. Accordingly, circuit configurations of the switched-capacitor circuits 21B and 22B will be described below.

3.1.1 Circuit Configuration of Switched-Capacitor Circuit 21B

In an example, the circuit configuration of the switched-capacitor circuit 21B can be described with reference to FIG. 12. The switched-capacitor circuit 21B has a ladder circuit configuration. In an example, the switched-capacitor circuit 21B includes capacitors C110 to C114, C120, and C130, switches S111 to S114, S121 to S124, and S131 to S134, the input terminal 211, and output terminals 213 to 215. Energy and charges are input into the node N11 from the pre-regulator circuit 10A through the input terminal 211 and are output to the supply modulator 30A from nodes N11 to N13 through the output terminals 213 to 215.

The output terminal 215 is an example of the first output terminal and is a terminal for supplying an output voltage (e.g., V13) to the supply modulator 30A. The output terminal 215 is connected to the supply modulator 30A outside the switched-capacitor circuit 21B and is connected to the node N13 inside the switched-capacitor circuit 21B.

The output voltage (e.g., V13) is an example of the voltage included in the plurality of first discrete voltages and is generated from the regulated voltage (e.g., V11). In the present embodiment, the output voltage (e.g., V13) is lower than the output voltage (e.g., V12).

The capacitors C111 to C114 are flying capacitors and are used for raising and/or lowering the regulated voltage (e.g., V11) supplied from the pre-regulator circuit 10A. In an example, the capacitors C111 to C114 cause charges to move between the capacitors C111 to C114 and the nodes N11 to N13 and the ground such that V11 to V13 satisfying (V11−V12):(V12−V13):(V13−VG)=1:1:1 and V11>V12>V13>VG are maintained in the three nodes N11 to N13.

One of two electrodes of the capacitor C113 is connected to one end of the switch S121 and to one end of the switch S122. The other of the two electrodes of the capacitor C113 is connected to one end of the switch S131 and to one end of the switch S132.

One of two electrodes of the capacitor C114 is connected to one end of the switch S123 and to one end of the switch S124. The other of the two electrodes of the capacitor C114 is connected to one end of the switch S133 and to one end of the switch S134.

The capacitors C111 to C114 can be charged and discharged in a complementary manner by repeating the first phase and the second phase.

In an example, in the first phase, the switches S112, S113, S122, S123, S132, and S133 are closed, and the switches S111, S114, S121, S124, S131, and S134 are open. Meanwhile, in the second phase, the switches S112, S113, S122, S123, S132, and S133 are open, and the switches S111, S114, S121, S124, S131, and S134 are closed.

By repeating the first phase and the second phase, for example, one of the capacitors C111 and C112 can be discharged to the capacitor C120 while the other of the capacitors C111 and C112 is being charged from the node N11. That is, the capacitors C111 and C112 can be charged and discharged in a complementary manner. In the same manner, the capacitors C113 and C114 can also be charged and discharged in a complementary manner.

The capacitors C110 to C130 are smoothing capacitors and are used for holding and smoothing the output voltages (e.g., V11 to V13) in the nodes N11 to N13.

The capacitor C130 is connected between the node N13 and the ground. In an example, one of two electrodes of the capacitor C130 is connected to the node N13. Meanwhile, the other of the two electrodes of the capacitor C130 is connected to the ground.

The switch S121 is connected between the capacitors C111 and C113 and the node N13. In an example, the one end of the switch S121 is connected to the other of the two electrodes of the capacitor C111 and to the one of the two electrodes of the capacitor C113. Meanwhile, the other end of the switch S121 is connected to the node N13.

The switch S122 is connected between the capacitors C111 and C113 and the node N12. In an example, the one end of the switch S122 is connected to the other of the two electrodes of the capacitor C111 and to the one of the two electrodes of the capacitor C113. Meanwhile, the other end of the switch S122 is connected to the node N12.

The switch S131 is connected between the capacitor C113 and the ground. In an example, the one end of the switch S131 is connected to the other of the two electrodes of the capacitor C113. Meanwhile, the other end of the switch S131 is connected to the ground.

The switch S132 is connected between the capacitor C113 and the node N13. In an example, the one end of the switch S132 is connected to the other of the two electrodes of the capacitor C113. Meanwhile, the other end of the switch S132 is connected to the node N13.

The switch S123 is connected between the capacitors C112 and C114 and the node N13. In an example, the one end of the switch S123 is connected to the other of the two electrodes of the capacitor C112 and to the one of the two electrodes of the capacitor C114. Meanwhile, the other end of the switch S123 is connected to the node N13.

The switch S124 is connected between the capacitors C112 and C114 and the node N12. In an example, the one end of the switch S124 is connected to the other of the two electrodes of the capacitor C112 and to the one of the two electrodes of the capacitor C114. Meanwhile, the other end of the switch S124 is connected to the node N12.

The switch S133 is connected between the capacitor C114 and the ground. In an example, the one end of the switch S133 is connected to the other of the two electrodes of the capacitor C114. Meanwhile, the other end of the switch S133 is connected to the ground.

The switch S134 is connected between the capacitor C114 and the node N13. In an example, the one end of the switch S134 is connected to the other of the two electrodes of the capacitor C114. Meanwhile, the other end of the switch S134 is connected to the node N13.

The first set of switches including the switches S112, S113, S122, S123, S132, and S133 and the second set of switches including the switches S111, S114, S121, S124, S131, and S134 are turned ON and OFF in a complementary manner, based on the control signal from the digital control circuit 60. In an example, in the first phase, the first set of switches is closed, and the second set of switches is open. Conversely, in the second phase, the first set of switches is open, and the second set of switches is closed.

The switched-capacitor circuit 21B, by operating in the above manner, can maintain almost equal voltages at both ends of each of the capacitors C110, C120, and C130. In an example, V11 to V13 satisfying (V11−V12):(V12−V13):(V13−VG)=1:1:1 are maintained in three nodes labeled V11 to −13.

(V11−V12):(V12−V13):(V13−VG) is not limited to 1:1:1 and may be designed to be any ratio.

3.1.2 Circuit Configuration of Switched-Capacitor Circuit 22B

In an example, the circuit configuration of the switched-capacitor circuit 22B can be described with reference to FIG. 12. The switched-capacitor circuit 22B has a differential circuit configuration. That is, in the switched-capacitor circuit 22B, the input terminal 222 is connected to the node N23 instead of the ground. In an example, the switched-capacitor circuit 22B includes the capacitors C210 to C212 and C220, the switches S211 to S214 and S221 to S224, input terminals 221 and 222, and the output terminals 223 to 225. Energy and charges are input into the nodes N21 and N23 from the pre-regulator circuit 10A through the input terminals 221 and 222 and are output to the supply modulator 30A from the nodes N21 to N23 through the output terminals 223 to 225.

The input terminal 221 is an example of the second input terminal and is a terminal for receiving the regulated voltage (e.g., V21) from the pre-regulator circuit 10A. The input terminal 221 is connected to the pre-regulator circuit 10A outside the switched-capacitor circuit 22B and is connected to the node N21 inside the switched-capacitor circuit 22B.

The regulated voltage (e.g., V21) is an example of the first regulated voltage and is supplied from the pre-regulator circuit 10A. In the present embodiment, the regulated voltage (e.g., V21) has the same level as the regulated voltage (e.g., V11) and has a level different from a level of a regulated voltage (e.g., V23).

The input terminal 222 is an example of the second input terminal and is a terminal for receiving the regulated voltage (e.g., V23) from the pre-regulator circuit 10A. The input terminal 222 is connected to the pre-regulator circuit 10A outside the switched-capacitor circuit 22B and is connected to the node N23 inside the switched-capacitor circuit 22B.

The regulated voltage (e.g., V23) is an example of the second regulated voltage and is supplied from the pre-regulator circuit 10A. In the present embodiment, the regulated voltage (e.g., V23) has a level different from a level of the regulated voltage (e.g., V21).

The output terminals 223 to 225 are examples of a plurality of second output terminals and are terminals for supplying the output voltages (e.g., V21 to V23) to the supply modulator 30A. The output terminals 223 to 225 are connected to the supply modulator 30A outside the switched-capacitor circuit 22B and are connected to the nodes N21 to N23 inside the switched-capacitor circuit 22B. The output terminal 223 may be integrated with the input terminal 221, and the output terminal 225 may be integrated with the input terminal 222.

The three output voltages (e.g., V21 to V23) are examples of the plurality of second discrete voltages and are generated from two regulated voltages (e.g., V21 and V23). In the present embodiment (or third embodiment), the output voltage (e.g., V22) is lower than the output voltage (e.g., V21) and is higher than the output voltage (e.g., V23).

The capacitors C210 to C212 and C220 and the switches S211 to S214 and S221 to S224 are the same as those of the switched-capacitor circuit 22. Thus, description thereof will be omitted.

3.2 Voltage Supply Method

In an exemplary aspect of the disclosure, a voltage supply method according to the present embodiment (or third embodiment) can be described with reference to FIG. 13. FIG. 13 is a flowchart illustrating the voltage supply method according to the present embodiment.

As shown in FIG. 13, at step S10B, the plurality of first discrete voltages (e.g., V11 to V13) are generated from the first regulated voltage (e.g., V11) using the switched-capacitor circuit 21B. At step S20B, the plurality of second discrete voltages (e.g., V21 to V23) are generated from the first regulated voltage (e.g., V21) and from the second regulated voltage (e.g., V23) using the switched-capacitor circuit 22B.

In an example of the step S20B, the plurality of first discrete voltages (e.g., V11 to V13) include a voltage (for example, V12 and/or V13) having a level different from a level of any of the plurality of second discrete voltages (e.g., V21 to V23). In addition, the plurality of second discrete voltages (e.g., V21 to V23) include a voltage (for example, V22 and/or V23) having a level different from a level of any of the plurality of first discrete voltages (e.g., V11 to V13). That is, the plurality of first discrete voltages are not a subset of the plurality of second discrete voltages, and the plurality of second discrete voltages are not a subset of the plurality of first discrete voltages.

At step S30B, at least one of the plurality of first discrete voltages (e.g., V11 to V13) and the plurality of second discrete voltages (e.g., V21 to V23) is selectively supplied to the power amplifier 2 using the supply modulator 30A. That is, at least one voltage is selected from the plurality of first discrete voltages (e.g., V11 to V13) and from the plurality of second discrete voltages (e.g., V21 to V23), and the selected at least one voltage is supplied to the power amplifier 2. The D-ET mode is applied to the power amplifier 2 by performing such voltage selection based on the envelope signal.

3.3 Plurality of Discrete Voltages

In an exemplary aspect of the disclosure, the plurality of discrete voltages that can be supplied by the tracker circuit 1B according to the present embodiment (or third embodiment) can be described with reference to FIG. 14. FIG. 14 is a diagram illustrating a plurality of discrete voltages that can be supplied in the present embodiment and in a comparative example.

In the comparative example, six discrete voltages are generated using a ladder switched-capacitor circuit. In this case, the six discrete voltages (e.g., V01 to V06) are disposed at even level intervals between the level L6 and the ground level, and only three voltages (e.g., V03 to V05) of the six discrete voltages (e.g., V01 to V06) are included in the high frequency range (e.g., L2 to L4.5).

Meanwhile, in the present embodiment, three first discrete voltages (e.g., V11 to V13) are generated from the first regulated voltage (e.g., V11) using the ladder switched-capacitor circuit 21B, and three second discrete voltages (e.g., V21 to V23) are generated from the first regulated voltage (e.g., V21) and from the second regulated voltage (e.g., V23) using the differential switched-capacitor circuit 22B. Particularly, in the differential switched-capacitor circuit 22B, a voltage greater than or equal to a voltage corresponding to peak power is used as the first regulated voltage (e.g., V21), and a voltage less than or equal to a voltage corresponding to the average power is used as the second regulated voltage (e.g., V23). The voltage corresponding to the peak power means a power supply voltage that is optimized with respect to the power-added efficiency of the power amplifier 2 in peak output power of the radio frequency signal amplified by the power amplifier 2. In addition, the voltage corresponding to the average power means a power supply voltage that is optimized with respect to the power-added efficiency of the power amplifier 2 in average output power of the radio frequency signal amplified by the power amplifier 2. In an example, the six discrete voltages (e.g., V11 to V13 and V21 to V23) are disposed at uneven level intervals between the level L6 and the ground level, and four voltages (V12, V13, V22, and V23) of the six discrete voltages (V11 to V13 and V21 to V23) are included in the high frequency range in FIG. 14.

In the present embodiment (or third embodiment), the number of voltages included in the high frequency range can be increased while an increase in the total number of the plurality of discrete voltages is suppressed compared to that in the comparative example, and the power-added efficiency of the power amplifier 2 can be improved. Conversely, when the number of voltages included in the high frequency range is increased using one ladder switched-capacitor circuit as in the comparative example, the total number of the plurality of discrete voltages is increased. Accordingly, the tracker circuit 1B according to the present embodiment (or third embodiment) can contribute to improvement of the power efficiency and size reduction.

That is, in the present embodiment (or third embodiment), the number of voltages included in the high frequency range with respect to the total number of the plurality of discrete voltages can be relatively increased, and improvement of the power efficiency of the entire system can be achieved while size increase of the tracker circuit 1B is suppressed.

As described above in FIGS. 12-14, the tracker circuit 1B according to the present embodiment (or third embodiment) includes the switched-capacitor circuit 21B configured to generate the plurality of first discrete voltages (for example, V11 to V13), the switched-capacitor circuit 22B configured to generate the plurality of second discrete voltages (for example, V21 to V23), and the supply modulator 30A configured to selectively output at least one of the plurality of first discrete voltages (for example, V11 to V13) and the plurality of second discrete voltages (for example, V21 to V23) to the power amplifier 2. The plurality of first discrete voltages (for example, V11 to V13) include a voltage (for example, V12 and V13) having a level different from a level of any of the plurality of second discrete voltages (for example, V21 to V23). The plurality of second discrete voltages (for example, V21 to V23) include a voltage (for example, V22 and V23) having a level different from a level of any of the plurality of first discrete voltages (for example, V11 to V13).

According to another aspect of the disclosure, the tracker circuit 1B according to the present embodiment (or third embodiment) includes the switched-capacitor circuit 21B including the input terminal 211 and the plurality of output terminals 213 to 215 that output the plurality of respective first discrete voltages (for example, V11 to V13), the switched-capacitor circuit 22B including the input terminal 221 and the plurality of output terminals 223 to 225 that output the plurality of respective second discrete voltages (for example, V21 to V23), and the supply modulator 30A including the plurality of input terminals 301 to 306 connected to the plurality of output terminals 213 to 215 and 223 to 225, respectively, and the output terminal 307 connected to the power amplifier 2. The plurality of first discrete voltages (for example, V11 to V13) include a voltage (for example, V12 and V13) having a level different from a level of any of the plurality of second discrete voltages (for example, V21 to V23). The plurality of second discrete voltages (for example, V21 to V23) include a voltage (for example, V22 and V23) having a level different from a level of any of the plurality of first discrete voltages (for example, V11 to V13).

According to this configuration of the third embodiment, by generating the plurality of first discrete voltages (for example, V11 to V13) via the switched-capacitor circuit 21B and generating the plurality of second discrete voltages (for example, V21 to V23) via the switched-capacitor circuit 22B, the plurality of discrete voltages (for example, V11 to V13 and V21 to V23) can be generated at uneven level intervals. Accordingly, a large number of discrete voltages can be generated in a voltage range (e.g., a high frequency range) suitable for the power having a higher frequency of occurrence near the average power of the radio frequency signal while an increase in the total number of the plurality of discrete voltages is suppressed. Consequently, in the D-ET mode, voltages can be finely regulated with respect to the power having a higher frequency of occurrence, and the power-added efficiency of the power amplifier 2 can be improved. Furthermore, by suppressing an increase in the total number of the plurality of discrete voltages, a decrease in the power efficiency of the tracker circuit 1B can be suppressed.

In addition, for example, in the tracker circuit 1B according to the present embodiment (or third embodiment), the switched-capacitor circuit 21B may be configured to generate the plurality of first discrete voltages (for example, V11 to V13) from the first regulated voltage (for example, V11), and the switched-capacitor circuit 22B may be configured to generate the plurality of second discrete voltages (for example, V21 to V23) from the first regulated voltage (for example, V21=V11) and from the second regulated voltage (V23) having a level different from a level of the first regulated voltage (V21).

According to another exemplary aspect of the disclosure, in the tracker circuit 1B according to the present embodiment (or third embodiment), the switched-capacitor circuit 22B may include the two input terminals 221 and 222. The input terminal 211 may receive the first regulated voltage (for example, V11). The input terminal 221 may receive the first regulated voltage (for example, V21=V11). The input terminal 222 may receive the second regulated voltage (for example, V23) having a level different from a level of the first regulated voltage (for example, V21).

According to this configuration of the third embodiment, by using the two regulated voltages having different levels in the switched-capacitor circuit 22B, the plurality of second discrete voltages can be concentrated in the high frequency range, and this is effective for improving the power-added efficiency of the power amplifier 2.

In addition, for example, in the tracker circuit 1B according to the present embodiment, the switched-capacitor circuit 22B may be configured to generate, based on the difference between the first regulated voltage (for example, V21) and the second regulated voltage (for example, V23), the plurality of second discrete voltages (for example, V21 to V23).

According to this configuration of the third embodiment, by using the differential switched-capacitor circuit 22B, the plurality of second discrete voltages can be concentrated in the high frequency range, and this is effective for improving the power-added efficiency of the power amplifier 2.

In addition, for example, in the tracker circuit 1B according to the present embodiment, the first regulated voltage (for example, V11=V21) may be greater than or equal to the voltage corresponding to the peak power of the radio frequency signal amplified by the power amplifier 2, and the second regulated voltage (for example, V23) may be less than or equal to the voltage corresponding to the average power of the radio frequency signal.

According to this configuration of the third embodiment, the plurality of second discrete voltages can be effectively concentrated in the high frequency range by the differential switched-capacitor circuit 22B, and further improvement of the power-added efficiency of the power amplifier 2 can be achieved.

In addition, for example, the tracker circuit 1B according to the present embodiment may further include the pre-regulator circuit 10A that converts the input voltage into the first regulated voltage (for example, V11=V21) and into the second regulated voltage (for example, V23).

According to this configuration of the third embodiment, two regulated voltages having levels different from each other can be generated by the pre-regulator circuit 10A.

In addition, the communication device 7 according to the present embodiment includes the tracker circuit 1B, the RFIC 5 configured to process the radio frequency signal, and the radio frequency circuit 4 that includes the power amplifier 2 and that is configured to transmit the radio frequency signal between the RFIC 5 and the antenna 6.

According to this configuration of the third embodiment, the same effect as the tracker circuit 1B can be implemented in the communication device 7, and this is effective for reducing power consumption.

In addition, as shown in FIG. 13, the voltage supply method according to the present embodiment (or third embodiment) includes generating the plurality of first discrete voltages (for example, V11 to V13) using the switched-capacitor circuit 21B at step S10B, generating the plurality of second discrete voltages (for example, V21 to V23) using the switched-capacitor circuit 22B at step S20B, and selectively outputting at least one of the plurality of first discrete voltages (for example, V11 to V13) and the plurality of second discrete voltages (for example, V21 to V23) to the power amplifier 2 at step S30B. The plurality of first discrete voltages (for example, V11 to V13) include a voltage (for example, V12 and V13) having a level different from a level of any of the plurality of second discrete voltages (for example, V21 to V23). The plurality of second discrete voltages (for example, V21 to V23) include a voltage (for example, V22 and V23) having a level different from a level of any of the plurality of first discrete voltages (for example, V11 to V13).

According to this configuration of the third embodiment, by generating the plurality of first discrete voltages (for example, V11 to V13) via the switched-capacitor circuit 21B and generating the plurality of second discrete voltages (for example, V21 to V23) via the switched-capacitor circuit 22B, the plurality of discrete voltages (for example, V11 to V13 and V21 to V23) can be generated at uneven level intervals. Accordingly, a large number of discrete voltages can be generated in a voltage range (e.g., a high frequency range) suitable for the power having a higher frequency of occurrence near the average power of the radio frequency signal while an increase in the total number of the plurality of discrete voltages is suppressed. Consequently, in the D-ET mode, voltages can be finely regulated with respect to the power having a higher frequency of occurrence, and the power-added efficiency of the power amplifier 2 can be improved. Furthermore, by suppressing an increase in the total number of the plurality of discrete voltages, a decrease in the power efficiency of the tracker circuit 1B can be suppressed.

In addition, in the voltage supply method according to the present embodiment, the plurality of first discrete voltages (for example, V11 to V13) may be generated from the first regulated voltage (for example, V11), and the plurality of second discrete voltages (for example, V21 to V23) may be generated from the first regulated voltage (for example, V21=V11) and from the second regulated voltage (for example, V23) having a level different from a level of the first regulated voltage (for example, V21).

According to this configuration of the third embodiment, by using the two regulated voltages having different levels, the plurality of second discrete voltages can be concentrated in the high frequency range, and this is effective for improving the power-added efficiency of the power amplifier 2.

Figure 15:
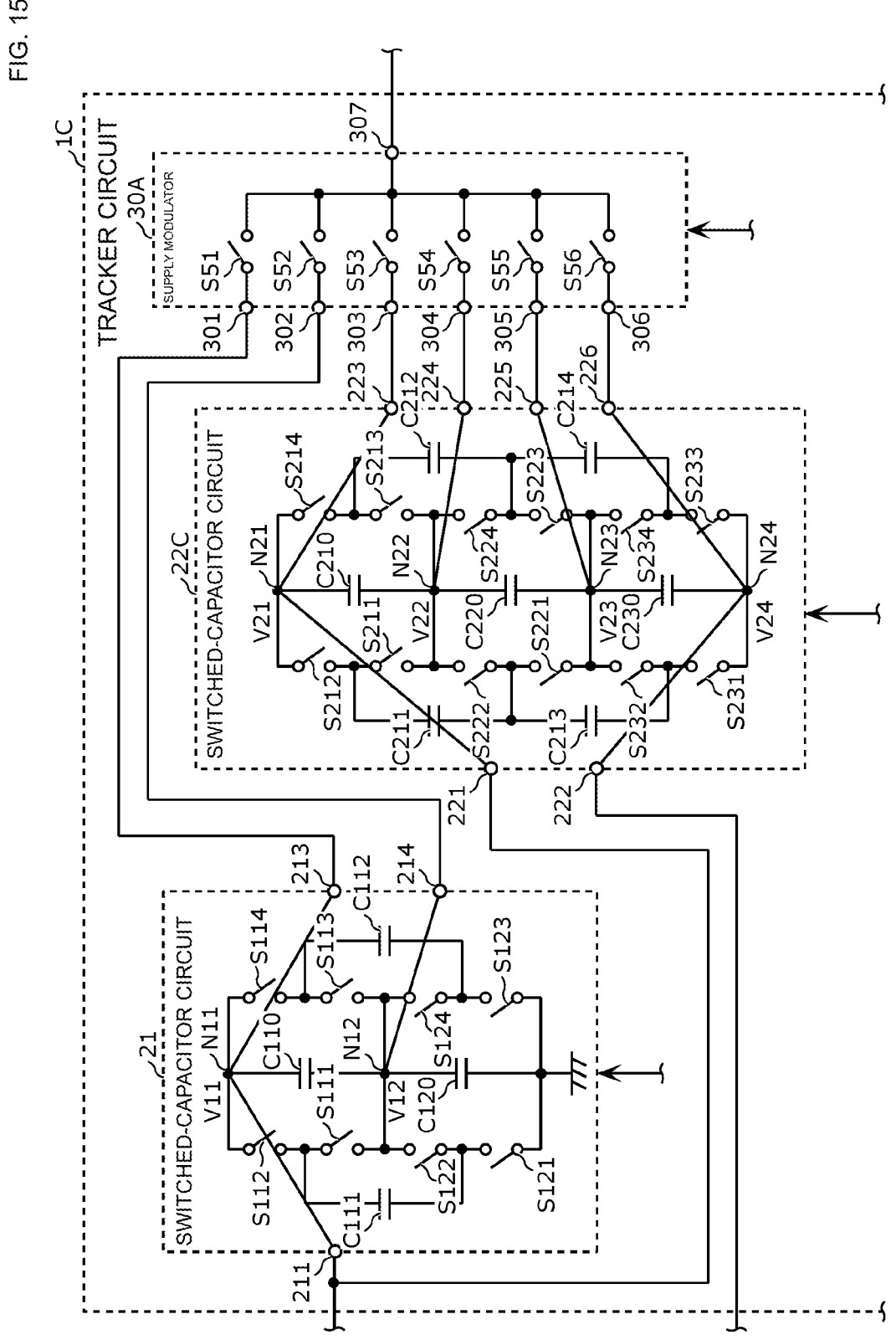
FIG. 15 is a partial circuit configuration diagram of a tracker circuit according to an exemplary Embodiment 4.
Figure 16:
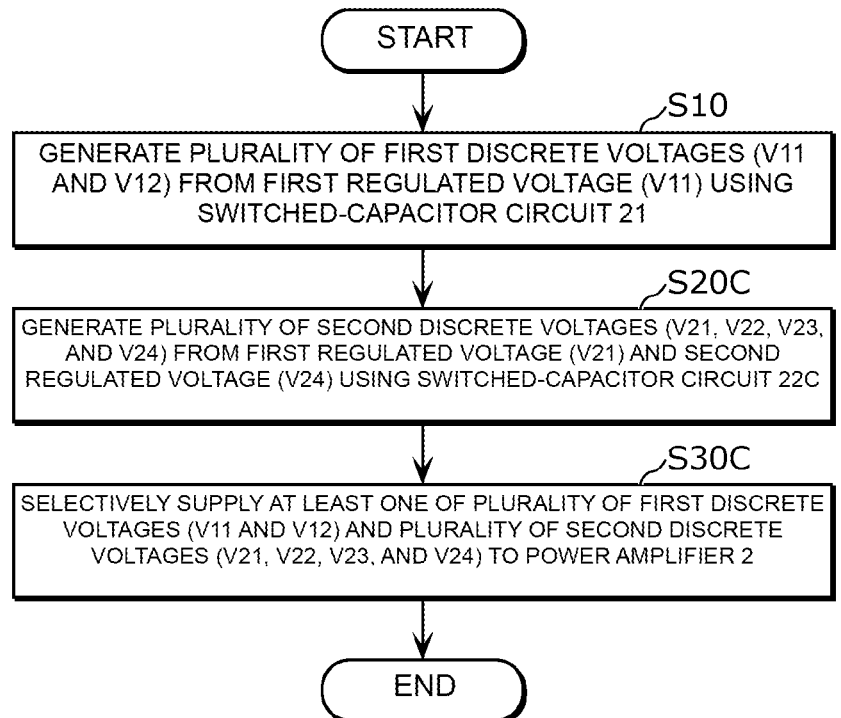
FIG. 16 is a flowchart illustrating a voltage supply method according to the exemplary Embodiment 4.
Figure 17:
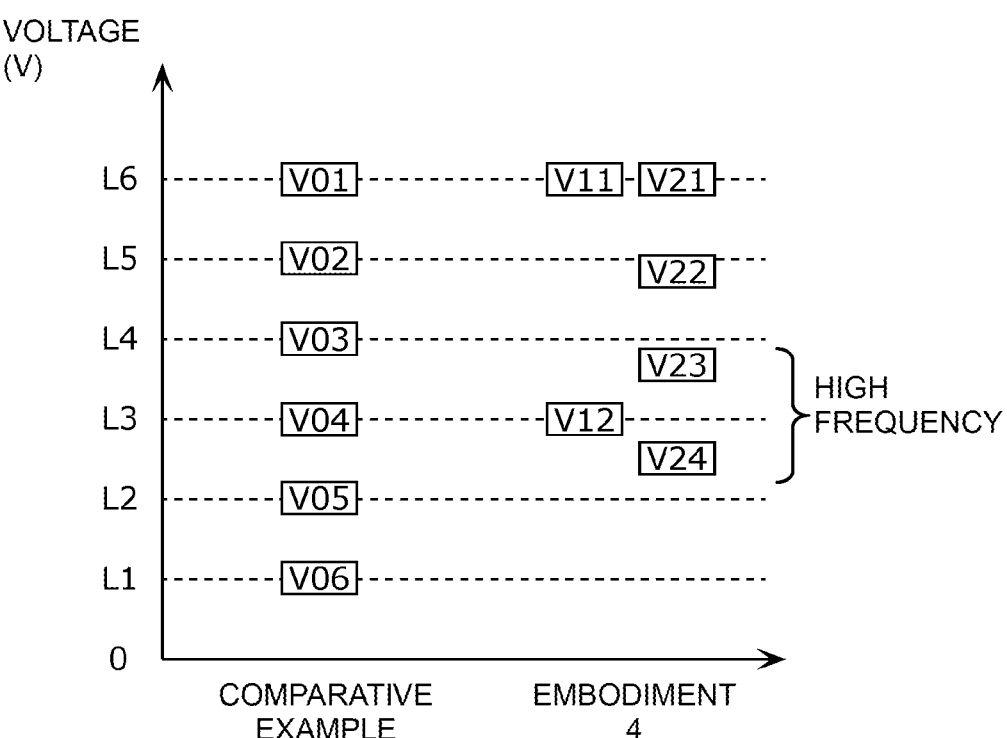
FIG. 17 is a diagram illustrating a plurality of discrete voltages that can be supplied in the exemplary Embodiment 4 and in a comparative example.

In an exemplary aspect, a fourth embodiment (or Embodiment 4) of the disclosure can be provided in FIGS. 15-17.

In the present embodiment (or fourth embodiment), the number of the plurality of discrete voltages generated by each of two switched-capacitor circuits is mainly different from that in Embodiment 3. Hereinafter, points of the present embodiment different from Embodiments 1 to 3 will be mainly described with reference to the drawings.

The communication device 7 according to the present embodiment is the same as the communication device 7 according to Embodiment 3 except that a tracker circuit 1C is provided instead of the tracker circuit 1B. Accordingly, the tracker circuit 1C will be described below, and illustration and description of other circuits will be omitted, as appropriate.

4.1 Circuit Configuration of Tracker Circuit 1C

In an example, an exemplary circuit configuration of the tracker circuit 1C can be described with reference to FIG. 15. FIG. 15 is a partial circuit configuration diagram of the tracker circuit 1C according to the present embodiment.

FIG. 15 is an exemplary circuit configuration, and the tracker circuit 1C may be mounted using any of various circuit mounting methods and circuit technologies. Accordingly, description of the tracker circuit 1C provided below is not to be interpreted as being limiting.

The tracker circuit 1C is the same as the tracker circuit 1A according to Embodiment 2 except that a switched-capacitor circuit 22C is provided instead of the switched-capacitor circuit 22A. Accordingly, a circuit configuration of the switched-capacitor circuit 22C will be described below.

4.1.1 Circuit Configuration of Switched-Capacitor Circuit 22C

In an example, the circuit configuration of the switched-capacitor circuit 22C can be described with reference to FIG. 15. The switched-capacitor circuit 22C has a differential circuit configuration. That is, in the switched-capacitor circuit 22C, the input terminal 222 is connected to the node N24 instead of the ground. In an example, the switched-capacitor circuit 22C includes the capacitors C210 to C214, C220, and C230, the switches S211 to S214, S221 to S224, and S231 to S234, the input terminals 221 and 222, and the output terminals 223 to 226. Energy and charges are input into the nodes N21 and N24 from the pre-regulator circuit 10A through the input terminals 221 and 222 and are output to the supply modulator 30A from the nodes N21 to N24 through the output terminals 223 to 226.

The input terminal 221 is an example of the second input terminal and is a terminal for receiving the regulated voltage (e.g., V21) from the pre-regulator circuit 10A. The input terminal 221 is connected to the pre-regulator circuit 10A outside the switched-capacitor circuit 22C and is connected to the node N21 inside the switched-capacitor circuit 22C.

The regulated voltage (e.g., V21) is an example of the first regulated voltage and is supplied from the pre-regulator circuit 10A. In the present embodiment, the regulated voltage (e.g., V21) has the same level as the regulated voltage (e.g., V11) and has a level different from a level of a regulated voltage (e.g., V23).

The input terminal 222 is an example of the second input terminal and is a terminal for receiving a regulated voltage (e.g., V24) from the pre-regulator circuit 10A. The input terminal 222 is connected to the pre-regulator circuit 10A outside the switched-capacitor circuit 22C and is connected to the node N23 inside the switched-capacitor circuit 22C.

The regulated voltage (e.g., V24) is an example of the second regulated voltage and is supplied from the pre-regulator circuit 10A. In the present embodiment, the regulated voltage (e.g., V24) has a level different from a level of the regulated voltage (e.g., V21).

The output terminals 223 to 226 are examples of the plurality of second output terminals and are terminals for supplying output voltages (e.g., V21 to V24) to the supply modulator 30A. The output terminals 223 to 226 are connected to the supply modulator 30A outside the switched-capacitor circuit 22C and are connected to the nodes N21 to N24 inside the switched-capacitor circuit 22C. The output terminal 223 may be integrated with the input terminal 221, and the output terminal 226 may be integrated with the input terminal 222.

The four output voltages (e.g., V21 to V24) are examples of the plurality of second discrete voltages and are generated from two regulated voltages (e.g., V21 and V24). In the present embodiment, the output voltage (e.g., V21) is higher than the output voltage (e.g., V22), the output voltage (e.g., V22) is higher than the output voltage (e.g., V23), and the output voltage (e.g., V23) is higher than the output voltage (e.g., V24).

The capacitors C210 to C214, C220, and C230 and the switches S211 to S214, S221 to S224, and S231 to S234 are the same as those of the switched-capacitor circuit 22. Thus, description thereof will be omitted.

4.2 Voltage Supply Method

In an example, a voltage supply method according to the present embodiment (or fourth embodiment) can be described with reference to FIG. 16. FIG. 16 is a flowchart illustrating the voltage supply method according to the present embodiment (or fourth embodiment).

As shown in FIG. 16, at step S10, the plurality of first discrete voltages (e.g., V11 and V12) are generated from the first regulated voltage (e.g., V11) using the switched-capacitor circuit 21. At step S20C, the plurality of second discrete voltages (e.g., V21 to V24) are generated from the first regulated voltage (e.g., V21) and from the second regulated voltage (e.g., V24) using the switched-capacitor circuit 22C.

In an example of the step S20C, the plurality of first discrete voltages (e.g., V11 and V12) include a voltage (for example, V12) having a level different from a level of any of the plurality of second discrete voltages (e.g., V21 to V24). In addition, the plurality of second discrete voltages (e.g., V21 to V24) include a voltage (for example, V22 to V24 or any combination thereof) having a level different from a level of any of the plurality of first discrete voltages (e.g., V11 and V12). That is, the plurality of first discrete voltages is not a subset of the plurality of second discrete voltages, and the plurality of second discrete voltages are not a subset of the plurality of first discrete voltages. Further-more, the number of the plurality of second discrete voltages (e.g., V21 to V24) is larger than the number of the plurality of first discrete voltages (e.g., V11 and V12).

At step S30C, at least one of the plurality of first discrete voltages (e.g., V11 and V12) and the plurality of second discrete voltages (e.g., V21 to V24) is selectively supplied to the power amplifier 2 using the supply modulator 30A. That is, at least one voltage is selected from the plurality of first discrete voltages (e.g., V11 and V12) and from the plurality of second discrete voltages (e.g., V21 to V24), and the selected at least one voltage is supplied to the power amplifier 2. The D-ET mode is applied to the power amplifier 2 by performing such voltage selection based on the envelope signal.

4.3 Plurality of Discrete Voltages

In an exemplary aspect, the plurality of discrete voltages that can be supplied by the tracker circuit 1C according to the present embodiment (or fourth embodiment) can be described with reference to FIG. 17. FIG. 17 is a diagram illustrating a plurality of discrete voltages that can be supplied in the present embodiment and in a comparative example.

In the comparative example, six discrete voltages are generated using a ladder switched-capacitor circuit. In this case, the six discrete voltages (e.g., V01 to V06) are dis-posed at even level intervals between the level L6 and the ground level, and only two voltages (e.g., V03 and V04) of the six discrete voltages (e.g., V01 to V06) are included in the high frequency range (e.g., L2.5 to L4).

Meanwhile, in the present embodiment, two first discrete voltages (e.g., V11 and V12) are generated from the first regulated voltage (e.g., V11) using the ladder switched-capacitor circuit 21, and four second discrete voltages (e.g., V21 to V24) are generated from the first regulated voltage (e.g., V21) and from the second regulated voltage (e.g., V24) using the differential switched-capacitor circuit 22C. Par-ticularly, in the differential switched-capacitor circuit 22C, a voltage greater than or equal to the voltage corresponding to the peak power is used as the first regulated voltage (e.g., V21), and a voltage less than or equal to the voltage corresponding to the average power is used as the second regulated voltage (e.g., V24).

In an example of FIG. 17, the six discrete voltages (e.g., V11, V12, and V21 to V24) are disposed at uneven level intervals between the level L6 and the ground level, and three voltages (e.g., V12, V23, and V24) of the six discrete voltages (e.g., V11, V12, and V21 to V24) are included in the high frequency range in FIG. 17.

In the present embodiment (or fourth embodiment), the number of voltages included in the high frequency range can be increased while an increase in the total number of the plurality of discrete voltages is suppressed compared to that in the comparative example, and the power-added efficiency of the power amplifier 2 can be improved. Conversely, when the number of voltages included in the high frequency range is increased using one ladder switched-capacitor circuit as in the comparative example, the total number of the plurality of discrete voltages is increased. Accordingly, the tracker cir-cuit 1C according to the present embodiment can contribute to improvement of the power efficiency and size reduction.

That is, in the present embodiment (or fourth embodi-ment), the number of voltages included in the high frequency range with respect to the total number of the plurality of discrete voltages can be relatively increased, and improvement of the power efficiency of the entire system can be achieved while size increase of the tracker circuit 1C is suppressed.

4.4 Effect

As described above in FIGS. 15-17, the tracker circuit 1C according to the present embodiment (or fourth embodi-ment) includes the switched-capacitor circuit 21 configured to generate the plurality of first discrete voltages (for example, V11 and V12), the switched-capacitor circuit 22C configured to generate the plurality of second discrete volt-ages (for example, V21 to V24), and the supply modulator 30A configured to selectively output at least one of the plurality of first discrete voltages (for example, V11 and V12) and the plurality of second discrete voltages (for example, V21 to V24) to the power amplifier 2. The plurality of first discrete voltages (for example, V11 and V12) include a voltage (for example, V12) having a level different from a level of any of the plurality of second discrete voltages (for example, V21 to V24). The plurality of second discrete voltages (for example, V21 to V24) include a voltage (for example, V22 to V24) having a level different from a level of any of the plurality of first discrete voltages (for example, V11 and V12).

According to another exemplary aspect of the disclosure, the tracker circuit 1C according to the present embodiment (or fourth embodiment) includes the switched-capacitor circuit 21 including the input terminal 211 and the plurality of output terminals 213 and 214 that output the plurality of respective first discrete voltages (for example, V11 and V12), the switched-capacitor circuit 22C including the input terminal 221 and the plurality of output terminals 223 to 226 that output the plurality of respective second discrete volt-ages (for example, V21 to V24), and the supply modulator 30A including the plurality of input terminals 301 to 306 connected to the plurality of output terminals 213, 214, and 223 to 226, respectively, and the output terminal 307 con-nected to the power amplifier 2. The plurality of first discrete voltages (for example, V11 and V12) include a voltage (for example, V12) having a level different from a level of any of the plurality of second discrete voltages (for example, V21 to V24). The plurality of second discrete voltages (for example, V21 to V24) include a voltage (for example, V22 to V24) having a level different from a level of any of the plurality of first discrete voltages (for example, V11 and V12).

According to this configuration of the fourth embodiment, by generating the plurality of first discrete voltages (for example, V11 and V12) via the switched-capacitor circuit 21 and generating the plurality of second discrete voltages (for example, V21 to V24) via the switched-capacitor circuit 22C, the plurality of discrete voltages (for example, V11, V12, and V21 to V24) can be generated at uneven level intervals. Accordingly, a large number of discrete voltages can be generated in a voltage range (e.g., a high frequency range) suitable for the power having a higher frequency of occurrence near the average power of the radio frequency signal while an increase in the total number of the plurality of discrete voltages is suppressed. Consequently, in the D-ET mode, voltages can be finely regulated with respect to the power having a higher frequency of occurrence, and the power-added efficiency of the power amplifier 2 can be improved. Furthermore, by suppressing an increase in the total number of the plurality of discrete voltages, a decrease in the power efficiency of the tracker circuit 1C can be suppressed.

In addition, for example, in the tracker circuit 1C according to the present embodiment, the switched-capacitor circuit 21 may be configured to generate the plurality of first discrete voltages (for example, V11 to V13) from the first regulated voltage (for example, V11), and the switched-capacitor circuit 22C may be configured to generate the plurality of second discrete voltages (for example, V21 to V24) from the first regulated voltage (for example, V21=V11) and from the second regulated voltage (for example, V23) having a level different from a level of the first regulated voltage (V21).

According to another exemplary aspect of the disclosure, in the tracker circuit 1C according to the present embodiment (fourth embodiment), the switched-capacitor circuit 22C may include the two input terminals 221 and 222. The input terminal 211 may receive the first regulated voltage (for example, V11). The input terminal 221 may receive the first regulated voltage (for example, V21=V11). The input terminal 222 may receive the second regulated voltage (for example, V23) having a level different from a level of the first regulated voltage (for example, V21).

According to this configuration of the fourth embodiment, by using the two regulated voltages having different levels in the switched-capacitor circuit 22C, the plurality of second discrete voltages can be concentrated in the high frequency range, and this is effective for improving the power-added efficiency of the power amplifier 2.

In addition, for example, in the tracker circuit 1C according to the present embodiment, the switched-capacitor circuit 22C may be configured to generate, based on the difference between the first regulated voltage (for example, V21) and the second regulated voltage (for example, V23), the plurality of second discrete voltages (for example, V21 to V24).

According to this configuration of the fourth embodiment, by using the differential switched-capacitor circuit 22C, the plurality of second discrete voltages can be concentrated in the high frequency range, and this is effective for improving the power-added efficiency of the power amplifier 2.

In addition, for example, in the tracker circuit 1C according to the present embodiment, the number (for example, four) of the plurality of second discrete voltages (for example, V21 to V24) may be larger than the number (for example, two) of the plurality of first discrete voltages (for example, V11 and V12).

According to this configuration of the fourth embodiment, since the number of the plurality of second discrete voltages generated by the differential switched-capacitor circuit 22C is increased, the number of voltages included in the high frequency range can be increased, and this is effective for improving the power-added efficiency of the power amplifier 2.

In addition, for example, in the tracker circuit 1C according to the present embodiment, the first regulated voltage (for example, V11=V21) may be greater than or equal to the voltage corresponding to the peak power of the radio frequency signal amplified by the power amplifier 2, and the second regulated voltage (for example, V23) may be less than or equal to the voltage corresponding to the average power of the radio frequency signal.

According to this configuration of the fourth embodiment, the plurality of second discrete voltages can be concentrated in the high frequency range by the differential switched-capacitor circuit 22C, and further improvement of the power-added efficiency of the power amplifier 2 can be achieved.

In addition, for example, the tracker circuit 1C according to the present embodiment may further include the pre-regulator circuit 10A that converts the input voltage into the first regulated voltage (for example, V11=V21) and into the second regulated voltage (for example, V23).

According to this configuration of the fourth embodiment, two regulated voltages having levels different from each other can be generated by the pre-regulator circuit 10A.

In addition, the communication device 7 according to the present embodiment includes the tracker circuit 1C, the RFIC 5 configured to process the radio frequency signal, and the radio frequency circuit 4 that includes the power amplifier 2 and that is configured to transmit the radio frequency signal between the RFIC 5 and the antenna 6.

According to this configuration of the fourth embodiment, the same effect as the tracker circuit 1C can be implemented in the communication device 7, and this is effective for reducing power consumption.

In addition, as shown in FIG. 16, the voltage supply method according to the present embodiment (or fourth embodiment) includes generating the plurality of first discrete voltages (for example, V11 and V12) using the switched-capacitor circuit 21 at step S10, generating the plurality of second discrete voltages (for example, V21 to V24) using the switched-capacitor circuit 22C at step S20C, and selectively outputting at least one of the plurality of first discrete voltages (for example, V11 and V12) and the plurality of second discrete voltages (for example, V21 to V24) to the power amplifier 2 at step S30C. The plurality of first discrete voltages (for example, V11 and V12) include a voltage (for example, V12) having a level different from a level of any of the plurality of second discrete voltages (for example, V21 to V24). The plurality of second discrete voltages (for example, V21 to V24) include a voltage (for example, V22 to V24) having a level different from a level of any of the plurality of first discrete voltages (for example, V11 and V12).

According to this configuration of the fourth embodiment, by generating the plurality of first discrete voltages (for example, V11 and V12) via the switched-capacitor circuit 21 and generating the plurality of second discrete voltages (for example, V21 to V24) via the switched-capacitor circuit 22C, the plurality of discrete voltages (for example, V11, V12, and V21 to V24) can be generated at uneven level intervals. Accordingly, a large number of discrete voltages can be generated in a voltage range (e.g., a high frequency range) suitable for the power having a higher frequency of occurrence near the average power of the radio frequency signal while an increase in the total number of the plurality of discrete voltages is suppressed. Consequently, in the D-ET mode, voltages can be finely regulated with respect to the power having a higher frequency of occurrence, and the power-added efficiency of the power amplifier 2 can be improved. Furthermore, by suppressing an increase in the total number of the plurality of discrete voltages, a decrease in the power efficiency of the tracker circuit 1C can be suppressed.

In addition, in the voltage supply method according to the present embodiment (or fourth embodiment), the plurality of first discrete voltages (for example, V11 and V12) may be generated from the first regulated voltage (for example, V11), and the plurality of second discrete voltages (for example, V21 to V24) may be generated from the first regulated voltage (for example, V21=V11) and from the second regulated voltage (for example, V24) having a level different from a level of the first regulated voltage (for example, V21).

According to this configuration of the fourth embodiment, by using the two regulated voltages having different levels, the plurality of second discrete voltages can be concentrated in the high frequency range, and this is effective for improving the power-added efficiency of the power amplifier 2.

It is noted that the current disclosure is not limited to the Embodiments 1-4 that are discussed in FIGS. 2-17. Additional exemplary embodiments of the disclosure can also be included.

While the tracker circuit, the communication device, and the voltage supply method according to the present disclosure have been described above based on the embodiments, the tracker circuit, the communication device, and the voltage supply method according to the present disclosure are not limited to the embodiments. The present disclosure also includes other embodiments implemented by combining any constituents in the embodiments, modification examples obtained by carrying out various modifications perceived by those skilled in the art to the embodiments without departing from the gist of the present disclosure, and various devices incorporating the tracker circuit.

For example, in the circuit configurations of various circuits according to each of the embodiments, other circuit elements, wires, and the like may be provided on the paths connecting each circuit element and the signal paths disclosed in the drawings. For example, an inductor and/or a capacitor may be provided between the tracker circuit and the power amplifier.

In the switched-capacitor circuits according to each of the embodiments, connection relationships between the input terminals and the nodes may be changed. For example, in Embodiment 1, the input terminal 211 may be connected to the node N12 instead of the node N11. Even in this case, the same effect as Embodiment 1 can be obtained.

The plurality of first discrete voltages and the plurality of second discrete voltages in each of the embodiments are examples, and the plurality of first discrete voltages and the plurality of second discrete voltages are not limited to the embodiments. Particularly, the number of the plurality of first discrete voltages and the number of the plurality of second discrete voltages are not limited to the embodiments, and the level of the second regulated voltage is also not limited to the embodiments.

The tracker circuit according to each of the embodiments may include a plurality of supply modulators. In this case, the tracker circuit can supply different voltages to a plurality of power amplifiers.

Hereinafter, features of the tracker circuit, the communication device, and the voltage supply method described based on the embodiments can be described.

In a first example, a tracker circuit including a first switched-capacitor circuit configured to generate a plurality of first discrete voltages, a second switched-capacitor circuit configured to generate a plurality of second discrete voltages, and a supply modulator configured to selectively output at least one of the plurality of first discrete voltages and the plurality of second discrete voltages to a power amplifier, in which the plurality of first discrete voltages include a voltage having a level different from a level of any of the plurality of second discrete voltages, and the plurality of second discrete voltages include a voltage having a level different from a level of any of the plurality of first discrete voltages.

In a second example, the tracker circuit according to first example, in which the first switched-capacitor circuit is configured to generate the plurality of first discrete voltages from a first regulated voltage, the second switched-capacitor circuit is configured to generate the plurality of second discrete voltages from the first regulated voltage, a combination of a first number that is the number of the plurality of first discrete voltages and a second number that is the number of the plurality of second discrete voltages satisfies a predetermined condition, and the predetermined condition is (i) the first number is not a divisor of the second number and (ii) the second number is not a divisor of the first number.

In a third example, the tracker circuit according to first example, in which the first switched-capacitor circuit is configured to generate the plurality of first discrete voltages from a first regulated voltage, and the second switched-capacitor circuit is configured to generate the plurality of second discrete voltages from a second regulated voltage having a level different from a level of the first regulated voltage.

In a fourth example, the tracker circuit according to first example, in which the first switched-capacitor circuit is configured to generate the plurality of first discrete voltages from a first regulated voltage, and the second switched-capacitor circuit is configured to generate the plurality of second discrete voltages from the first regulated voltage and from a second regulated voltage having a level different from a level of the first regulated voltage. In a fifth example, the tracker circuit according to the fourth example, in which the second switched-capacitor circuit is configured to generate, based on a difference between the first regulated voltage and the second regulated voltage, the plurality of second discrete voltages.

In a sixth example, the tracker circuit according to the fourth example or the fifth example, in which the number of the plurality of second discrete voltages is larger than the number of the plurality of first discrete voltages.

In a seventh example, the tracker circuit according to any one of the fourth example to the sixth example, in which the first regulated voltage is greater than or equal to a voltage corresponding to peak power of a radio frequency signal amplified by the power amplifier, and the second regulated voltage is less than or equal to a voltage corresponding to average power of the radio frequency signal.

In an eighth example, the tracker circuit according to any one of the fourth example to the seventh example, further including a converter circuit that converts an input voltage into the first regulated voltage and into the second regulated voltage.

In a nineth example, a communication device including the tracker circuit according to any one of the first example to the eighth example, a signal processing circuit configured to process a radio frequency signal, and a radio frequency circuit that includes the power amplifier and that is configured to transmit the radio frequency signal between the signal processing circuit and an antenna.

In an tenth example, a tracker circuit including a first switched-capacitor circuit including a first input terminal and a plurality of first output terminals that each output a corresponding one of a plurality of first discrete voltages, a second switched-capacitor circuit including a second input terminal and a plurality of second output terminals that each output a corresponding one of a plurality of second discrete voltages, and a supply modulator including a plurality of third input terminals each connected to a corresponding one of the plurality of first output terminals and the plurality of second output terminals, and a third output terminal connected to a power amplifier, in which the plurality of first discrete voltages include a voltage having a level different from a level of any of the plurality of second discrete voltages, and the plurality of second discrete voltages include a voltage having a level different from a level of any of the plurality of first discrete voltages.

In an eleventh example, the tracker circuit according to the tenth example, in which the first input terminal and the second input terminal receive a first regulated voltage, a combination of a first number that is the number of the plurality of first discrete voltages and a second number that is the number of the plurality of second discrete voltages satisfies a predetermined condition, and the predetermined condition is (i) the first number is not a divisor of the second number and (ii) the second number is not a divisor of first number.

In a twelfth example, the tracker circuit according to the tenth example, in which the first input terminal receives a first regulated voltage, and the second input terminal receives a second regulated voltage having a level different from a level of the first regulated voltage.

In a thirteenth example, the tracker circuit according to the tenth example, in which the second switched-capacitor circuit includes two second input terminals including the second input terminal, the first input terminal receives a first regulated voltage, one of the two second input terminals receives the first regulated voltage, and the other of the two second input terminals receives a second regulated voltage having a level different from a level of the first regulated voltage.

In a fourteenth example, the tracker circuit according to the twelfth example or the thirteenth example, in which the number of the plurality of second discrete voltages is larger than the number of the plurality of first discrete voltages.

In a fifteenth example, the tracker circuit according to any one of the twelfth example to the fourteenth example, further including a converter circuit including a fourth input terminal that receives an input voltage, and two fourth output terminals that output the first regulated voltage and the second regulated voltage.

In a sixteenth example, a communication device including the tracker circuit according to any one of the tenth example to the fifteenth example, a signal processing circuit configured to process a radio frequency signal, and a radio frequency circuit that includes the power amplifier and that is configured to transmit the radio frequency signal between the signal processing circuit and an antenna.

In a seventeenth example, a voltage supply method including generating a plurality of first discrete voltages using a first switched-capacitor circuit, generating a plurality of second discrete voltages using a second switched-capacitor circuit, and selectively outputting at least one of the plurality of first discrete voltages and the plurality of second discrete voltages to a power amplifier, in which the plurality of first discrete voltages include a voltage having a level different from a level of any of the plurality of second discrete voltages, and the plurality of second discrete voltages include a voltage having a level different from a level of any of the plurality of first discrete voltages.

in an eighteenth example, the voltage supply method according to the seventeenth example, in which the plurality of first discrete voltages and the plurality of second discrete voltages are generated from regulated voltages having the same level, a combination of a first number that is the number of the plurality of first discrete voltages and a second number that is the number of the plurality of second discrete voltages satisfies a predetermined condition, and the predetermined condition is (i) the first number is not a divisor of the second number and (ii) the second number is not a divisor of the first number.

In a nineteenth example, the voltage supply method according to the seventeenth example, in which the plurality of first discrete voltages and the plurality of second discrete voltages are generated from respective regulated voltages having levels different from each other.

In a twentieth example, the voltage supply method according to the seventeenth example, in which the plurality of first discrete voltages is generated from a first regulated voltage, and the plurality of second discrete voltages are generated from the first regulated voltage and from a second regulated voltage having a level different from a level of the first regulated voltage.

The present disclosure can be widely used for communication devices such as a mobile phone as a tracker circuit that supplies a voltage to a power amplifier.

What is claimed:

1. A tracker circuit comprising:
a first switched-capacitor circuit configured to generate a plurality of first discrete voltages;
a second switched-capacitor circuit configured to generate a plurality of second discrete voltages; and
a supply modulator configured to selectively output at least one voltage of at least one of the plurality of first discrete voltages and the plurality of second discrete voltages to a power amplifier,
wherein the at least one voltage of the plurality of first discrete voltages has a level different than levels of the plurality of second discrete voltages, and
wherein the at least one voltage of the plurality of second discrete voltages has a level different than levels of the plurality of first discrete voltages.

2. The tracker circuit according to claim 1, wherein:
the first switched-capacitor circuit is configured to generate the plurality of first discrete voltages from a first regulated voltage,
the second switched-capacitor circuit is configured to generate the plurality of second discrete voltages from the first regulated voltage,
the plurality of first discrete voltages includes a first number of the plurality of first discrete voltages and the plurality of second discrete voltages includes a second number of the plurality of second discrete voltages, and
the first number and the second number satisfy a predetermined condition in a manner that (i) the first number is not a divisor of the second number and (ii) the second number is not a divisor of the first number.

3. The tracker circuit according to claim 1, wherein:
the first switched-capacitor circuit is configured to generate the plurality of first discrete voltages from a first regulated voltage, and
the second switched-capacitor circuit is configured to generate the plurality of second discrete voltages from a second regulated voltage, a level of the second regulated voltage being different from a level of the first regulated voltage.

4. The tracker circuit according to claim 1, wherein:
the first switched-capacitor circuit is configured to generate the plurality of first discrete voltages from a first regulated voltage, and
the second switched-capacitor circuit is configured to generate the plurality of second discrete voltages from the first regulated voltage and a second regulated voltage, a level of the second regulated voltage being different from a level of the first regulated voltage.

5. The tracker circuit according to claim 4, wherein the second switched-capacitor circuit is configured to generate, based on a difference between the first regulated voltage and the second regulated voltage, the plurality of second discrete voltages.

6. The tracker circuit according to claim 2, wherein the second number of the plurality of second discrete voltages is larger than the first number of the plurality of first discrete voltages.

7. The tracker circuit according to claim 4, wherein:
the first regulated voltage is greater than or equal to a voltage corresponding to a peak power of a radio frequency signal amplified by the power amplifier, and
the second regulated voltage is less than or equal to a voltage corresponding to an average power of the radio frequency signal.

8. The tracker circuit according to claim 4, further comprising a converter circuit that is configured to convert an input voltage into at least one of the first regulated voltage and the second regulated voltage.

9. A communication device comprising:
the tracker circuit according to claim 1;
a signal processing circuit configured to process a radio frequency signal; and
a radio frequency circuit that includes the power amplifier and that is configured to transmit the radio frequency signal between the signal processing circuit and an antenna.

10. A tracker circuit comprising:
a first switched-capacitor circuit including a first input terminal and a plurality of first output terminals, each of the plurality of first output terminals configured to output a respective one voltage of a plurality of first discrete voltages;
a second switched-capacitor circuit including a second input terminal and a plurality of second output terminals, each of the plurality of second output terminals configured to output a respective one voltage of a plurality of second discrete voltages; and
a supply modulator including (i) a plurality of third input terminals, each of the plurality of third input terminals being coupled to a respective terminal of either the plurality of first output terminals or the plurality of second output terminals, and (ii) a third output terminal coupled to a power amplifier,
wherein at least one voltage of the plurality of first discrete voltages has a level different from levels of the plurality of second discrete voltages, and
wherein at least one voltage of the plurality of second discrete voltages has a level different from levels the plurality of first discrete voltages.

11. The tracker circuit according to claim 10, wherein:
the first input terminal and the second input terminal are coupled to a first regulated voltage,
the plurality of first discrete voltages includes a first number of the plurality of first discrete voltages and the plurality of second discrete voltages includes a second number of the plurality of second discrete voltages, and
the first number and the second number satisfy a predetermined condition in a manner that (i) the first number is not a divisor of the second number and (ii) the second number is not a divisor of the first number.

12. The tracker circuit according to claim 10, wherein:
the first input terminal is configured to receive a first regulated voltage, and
the second input terminal is configured to receive a second regulated voltage, a level of the second regulated voltage being different from a level of the first regulated voltage.

13. The tracker circuit according to claim 10, wherein:
the second switched-capacitor circuit further includes a third input terminal,
the first input terminal is configured to receive a first regulated voltage,
the second input terminal is configured to receive the first regulated voltage, and
the third input terminal is configured to receive a second regulated voltage having a level different from a level of the first regulated voltage.

14. The tracker circuit according to claim 11, wherein the second number of the plurality of second discrete voltages is larger than the first number of the plurality of first discrete voltages.

15. The tracker circuit according to claim 12, further comprising a converter circuit including an input terminal that is configured to receive an input voltage, and two output terminals that are configured to output the first regulated voltage and the second regulated voltage, respectively.

16. A communication device comprising:
the tracker circuit according to claim 10;
a signal processing circuit configured to process a radio frequency signal; and
a radio frequency circuit that includes the power amplifier and that is configured to transmit the radio frequency signal between the signal processing circuit and an antenna.

17. A voltage supply method operated in a tracker circuit, the method comprising:
generating a plurality of first discrete voltages based on a first switched-capacitor circuit of the tracker circuit;
generating a plurality of second discrete voltages based on a second switched-capacitor circuit of the tracker circuit; and
selectively outputting at least one voltage of at least one of the plurality of first discrete voltages and the plurality of second discrete voltages to a power amplifier based on a supply modulator of the tracker circuit,
wherein the at least one voltage of the plurality of first discrete voltages has a level different from levels of the plurality of second discrete voltages, and
wherein the at least one voltage of the plurality of second discrete voltages has a level different from levels of the plurality of first discrete voltages.

18. The voltage supply method according to claim 17, wherein:
the plurality of first discrete voltages is generated from a first regulated voltage and the plurality of second discrete voltages is generated from a second regulated voltage, the first regulated voltage and the second regulated voltage having a same level,
the plurality of first discrete voltages includes a first number of the plurality of first discrete voltages and the plurality of second discrete voltages includes a second number of the plurality of second discrete voltages, and
the first number and the second number satisfy a predetermined condition in a manner that (i) the first number is not a divisor of the second number and (ii) the second number is not a divisor of the first number.

19. The voltage supply method according to claim 17, wherein the plurality of first discrete voltages and the plurality of second discrete voltages are generated from respective regulated voltages with different levels.

20. The voltage supply method according to claim 17, wherein:
the plurality of first discrete voltages is generated from a first regulated voltage, and the plurality of second discrete voltages is generated from the first regulated voltage and a second regulated voltage, a level of the second regulated voltage being different from a level of the first regulated voltage.

* * * * *